United States Patent
Thijs et al.

(10) Patent No.: US 7,923,266 B2
(45) Date of Patent: Apr. 12, 2011

(54) DESIGN METHODOLOGY FOR MUGFET ESD PROTECTION DEVICES

(75) Inventors: Steven Thijs, Willebroek (BE); Dimitri Linten, Boortmeerbeek (BE); David Eric Trémouilles, Villeneuve (FR)

(73) Assignee: IMEC, Leuven (BE)

( * ) Notice: Subject to any disclaimer, the term of this patent is extended or adjusted under 35 U.S.C. 154(b) by 155 days.

(21) Appl. No.: 12/437,294

(22) Filed: May 7, 2009

(65) Prior Publication Data

US 2009/0280582 A1    Nov. 12, 2009

(30) Foreign Application Priority Data

May 9, 2008  (EP) .................................. 08156029

(51) Int. Cl.
*H01L 21/66* (2006.01)
*H01L 21/332* (2006.01)
*H01L 21/00* (2006.01)
*H01L 21/84* (2006.01)
*H01L 21/336* (2006.01)

(52) U.S. Cl. ........... 438/14; 438/135; 438/157; 438/283

(58) Field of Classification Search .................... 438/14, 438/135, 157, 283; 716/4; 257/E21.521
See application file for complete search history.

(56) References Cited

OTHER PUBLICATIONS

Russ, Christian C. et al., "ESD Evaluation of the Emerging MuGFET Technology", IEEE Transactions on Device and Materials Reliability, vol. 7, No. 1, Mar. 2007, pp. 152-161.
Lee, Chi-Woo et al., "Device Design Guidelines for Nano-Scale MuGFETs", Solid-State Electronics, vol. 51, No. 3, Mar. 30, 2007, pp. 505-510.
Yim, Daebin et al., "Layout Optimization of ESD Protection TFO-NMOS by Two-Dimensional Device Simulation", Simulation of Semiconductor Processes and Devices, International Conference on Cambridge, MA, Sep. 8-10, 1997, pp. 29-31.
Khazhinsky, Michael G. et al., "Comprehensive ESD Protection Approach in Advanced CMOS SOI Technologies", Journal of Electrostatics, vol. 64, No. 11, Oct. 1, 2006, pp. 720-729.
Shigyo, N. et al., "ESD Protection Device Design Using Statistical Methods", Solid-State Electronics, vol. 46, No. 12, Dec. 1, 2002, pp. 2117-2122.
European Search Report, European Patent Application 09159669.2 dated Jul. 27, 2009.
Scholz et al., "Calibrated Wafer-Level HBM Measurement for Quasi-Static and Transient Device Analysis," EOS/ESD Symposium 07-89.
Tremouilles et al., "Understanding the Optimization of Sub-45nm FinFET Devices for ESD Applications," EOS/ESD Symposium 07-408.
Augendre et al., "On the Scalability of Source/Drain Current Enhancement in Thin Film sSOI," 2005 IEEE, p. 301-304.
Collaert et al., "Multi-gate Devices for the 32nm Technology Node and Beyond," 2007 IEEE, p. 143-146.
Choi et al., "Large Scale Integration and Reliability Consideration of Triple Gate Transistors," 2004 IEEE.
Hoffman et al., "GIDS (Gate-Induced Drain Leakage) and Parasitic Schottky Barrier Leakage Elimination in Aggressively Scaled HfO2/TiN FinFET Devices," 2005 IEEE.

(Continued)

*Primary Examiner* — William M. Brewster
(74) *Attorney, Agent, or Firm* — McDonnell Boehnen Hulbert & Berghoff LLP

(57) ABSTRACT

A method for manufacturing a MuGFET ESD protection device having a given layout by means of a given manufacturing process, the method comprising selecting multiple interdependent layout and process parameters of which a first set are fixed by said manufacturing process and a second set are variable, selecting multiple combinations of possible layout and process parameter values which meet predetermined ESD constraints; determining an optimum value for at least one other parameter in view of a predetermined design target apart from the predetermined ESD constraints; determining values for fin width ($W_{fin}$), gate length ($L_G$) and number of fins (N) on the basis of the optimum value; and manufacturing said MuGFET ESD protection device using the given manufacturing and process values.

13 Claims, 20 Drawing Sheets

OTHER PUBLICATIONS

"Physical Origin of Negative Differential Resistance in SOI Transistors," Electronic Letters 22nd Jun. 1989, vol. 25, No. 13, p. 827-828.

Fuiwara et al., "Impact of BOX Scaling on 30 nm Gate Legth FD SOI MOSFETs," 2008 IEEE, p. 180-182.

Parvais et al., "Analysis of the FinFET Parasitics for Improved RF Performances," IEEE 2007, p. 37-38.

Wu et al., "Analysis of Geometry-Dependent Parasitics in Multifin Double-Gate FinFETSs," IEEE Transactions on Electron Devices, vol. 54, No. 4, Apr. 2007.

The International Technology Roadmap for Semiconductors: 2007, Table FEP2b Starting Materials Technology Requirements-Long-Term Years.

Collaert et al., "Multi-Gate Devices for the 32nm Technology Node and Beyond: Challenges for Selective Epitaxial Growth," Think Solid Films 517 (2008) 101-104.

Collaert et al., "Multi-Gate Devices for the 32nm Technology Node and Beyond: Challenges for Selective Epitaxial Growth."

Collaert et al., "Tall Triple-Gae Devices with TiN/HfO2 Gate Stack," 2005 Symposium on VLSI Technology Digest of Technical Papers, p. 108-109.

European Search Report, European Patent Application No. 08156029.4, dated Aug. 27, 2008.

Shigyo, N. et al., "ESD Protection Device Design Using Statistical Methods", Solid State Electronics, Elsevier Science Publishers, vol. 46, No. 12, Dec. 1, 2002, pp. 2117-2122.

Trémouilles, D. et al., "Understanding the Optimization of Sub-45nm FinFET Devices for ESD Applications", 29th Electrical Overstress/Electrostatic Discharge Symposium, 2007, XP002488347, pp. 7A.5-1-7A.5-8.

Khazhinksy, Michael G. et al., "Comprehensive ESD Protection Approach in Advanced CMOS SOI Technologies", Journal of Electrostatics, Elsevier Science Publishers, vol. 64, No. 11, Oct. 1, 2006, pp. 720-729.

Yim, Daebin et al., "Layout Optimization of ESD Protection TFO-NMOS by Two-Dimensional Device Stimulation", Simulation of Semiconductor Processes and Devices, 1997. SISPAD '97, International Conference on Cambridge, MA, USA, Sep. 8, 1997, pp. 29-31.

Lee, Chi-Woo et al., "Device Design Guidelines for Nano-Scale MuGFETs", Solid-State Electronics, Elsevier Science Publishers, vol. 51, No. 3, Mar. 30, 1997, pp. 505-510.

DESIGN METHODOLOGY FOR MUGFET ESD PROTECTION DEVICES

CROSS-REFERENCE TO RELATED APPLICATIONS

The present application claims priority to European Patent Application EP 08156029.4 filed in the EPO Patent Office on May 9, 2008, the entire contents of which is incorporated herein by reference.

BACKGROUND

1. Field of the Invention

The present invention relates to designing and manufacturing MuGFET ESD Protection Devices.

2. Description of the Related Art

The FinFET transistor is the most widely studied multi-gate architecture for technology-scaling below 45 nm due to its excellent control of Short Channel Effects (SCE) and its compatibility with standard CMOS processing. In Trémouilles et al, "Understanding the Optimization of Sub-45 nm MuGFET Devices for ESD Applications", ESD 2007, pp 408-415, a variety of ESD device parameters (failure current $It_2$, holding voltage $V_h$, on-resistance $R_{on}$, leakage current and area consumption) of a Grounded-Gate-NMOS FinFET device were investigated as a function of different layout and process parameters. Among the layout and process parameters, there are always some which are fixed by the manufacturing process and others which can be chosen by the ESD design engineer to try and find a desired ESD performance.

In view of the interdependency of the layout and process parameters, i.e. the fact that changing one parameter inevitably influences one or more other parameters, Trémouilles et al. have acknowledged that the design of ESD protection for FinFET technology and hence more in general for MuGFET technology is very complex.

SUMMARY

It is an aim of the present invention to provide a method for manufacturing MuGFET ESD protection devices which can be better optimized towards any given design target.

This aim is achieved according to the invention with the method showing the technical steps of the first claim.

As used herein, "MuGFET" is an abbreviation for multi-gate field-effect transistor and is intended to refer to a MOSFET which incorporates more than one gate into a single device. The multiple gates may be controlled by a single gate electrode, wherein the multiple gate surfaces act electrically as a single gate, or by independent gate electrodes. An example of a multigate device employing independent gate electrodes is a Multiple Independent Gate Field Effect Transistor or MIGFET. Another example of a MuGFET is a FinFET in which the gate is formed by a plurality of fins.

The invention is intended for manufacturing a MuGFET ESD protection device, which has a given general layout and is to be manufactured by means of a given manufacturing process. In the method, multiple interdependent layout and process parameters are determined of which a first set are fixed by the manufacturing process and a second set are variable. The second set comprises at least a fin width, a gate length and a number of fins of the MuGFET ESD protection device. The second set further comprises a subset of at least one other parameter which is dependent on the fin width, gate length and number of fins, such as for example overall device area, maximum voltage, maximum voltage during voltage overshoot, leakage current, capacity or other.

The invention provides a solution for determining an optimal set for the plurality of interdependent parameters, by means of the following steps. First, multiple combinations of fin width, gate length and number of fins are selected, taking into account predetermined ESD constraints which have been determined in view of a desired ESD performance of the device. Next, multiple values are determined for the other parameter(s) of the subset on the basis of a predetermined relationship with the fin width, gate length and number of fins. Among these multiple values an optimum value is determined in view of meeting the design target, which is not one of the ESD constraints. Finally, the values for fin width, gate length and number of fins are determined on the basis of the/each optimum values for the parameter(s) of the subset.

The invention exploits a methodology which has the effect that the parameters which are to be optimized are determined first, i.e. their optimal value(s) are determined and afterwards these optimal value(s) are imposed when determining the other parameters. In other words, the optimized parameters are treated as constraints for the other parameters. This can simplify the complex process of determining all interdependent process and layout parameters of a MuGFET ESD protection device.

The parameters to be optimized may have to be optimized for reasons of ESD protection or for reasons other than ESD protection, e.g. in view of a desired behavior during normal functioning of the circuit which is protected. Indeed, the ESD design engineer is commonly not only faced with the ESD constraints which the protection device has to meet. There are commonly also other, non-ESD related requirements, specifications and the like which the ESD design engineer has to take into account and which severely complicate the design process in the case of MuGFET technology. This complex design process can be highly facilitated according to the invention.

Using the method of the invention, the ESD design engineer is presented with a clear, general procedure which he can easily adapt to the circumstances and needs with which he is faced. He can simply select the subset of parameter(s) for which the design needs to be optimized, determine its optimum value(s) first and subsequently determine the remainder of the parameters. Furthermore, if the design is changed and a new parameter is introduced, he can still use the same procedure by adding the new parameter in the relationships.

Using the methodology of the invention, better results can be obtained as one might intuitively think. For example, when optimizing towards area, one might think that the best device in MOS diode mode is a wide fin transistor with a minimum gate length which just fulfills the leakage requirements. However, when applying the methodology, the optimal solution turns out to be different, with an area of for example a 20% reduction compared to the intuitive solution. An example to prove the effect of the invention will be presented below.

In preferred embodiments of the method of the invention, the optimum values are determined by interpolation while taking into account the predetermined ESD constraints and possible other desired specifications of the device.

In embodiments of the method of the invention, the second set of parameters which can be determined independently from the manufacturing process can comprise one or more of the following layout parameters: a contact area ($L_{cont}$) and a folding factor of the ESD protection device.

In embodiments of the method of the invention, the following layout parameters can belong to either the first set (fixed by the manufacturing process) or the second set (independent from the manufacturing process), depending on the manufacturing process which is used: a distance between landing pad and gate (LSD), an overlap gate on fins ($W_{ext}$) and a fin-to-fin spacing (S).

In embodiments of the method of the invention, the following process parameters can belong to either the first set (fixed by the manufacturing process) or the second set (independent from the manufacturing process), depending on the manufacturing process which is used: strain, well implants, selective epitaxial growth (SEG), silicide blocking.

In embodiments of the method of the invention, the following parameters can belong to the subset of at least one parameter to be optimized: overall area of said device, maximum voltage, maximum voltage during voltage overshoot, leakage current, capacity.

BRIEF DESCRIPTION OF THE SEVERAL VIEWS OF THE DRAWINGS

The invention will be further elucidated by means of the following description and the appended figures.

DETAILED DESCRIPTION

Figure 1:
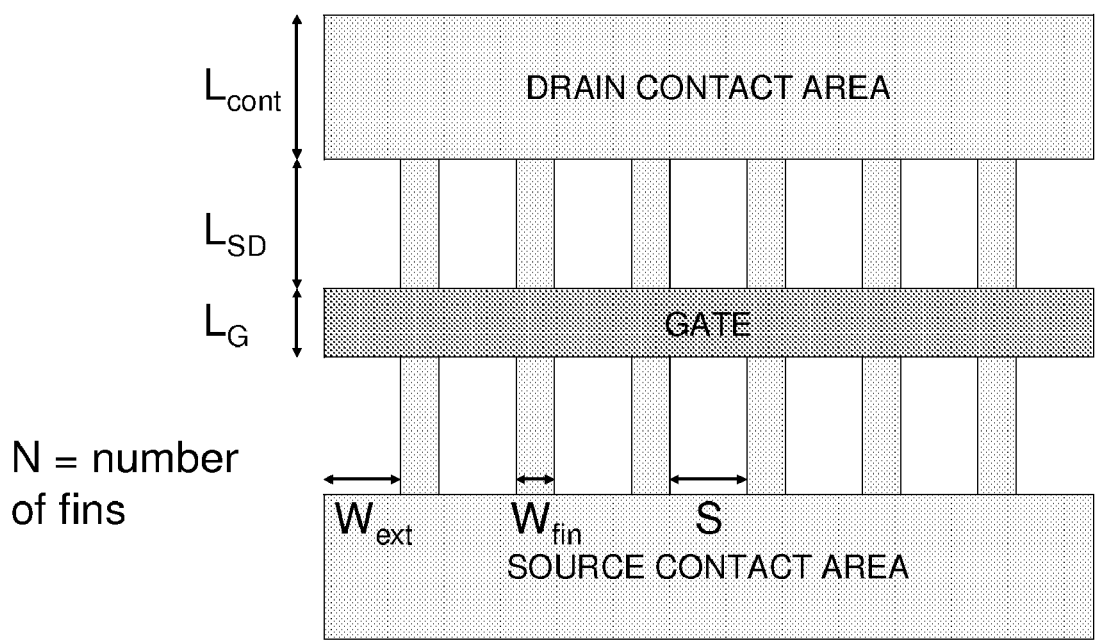
FIG. 1 shows a top layout view of a FinFET device, optimisable according to the invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

In the following, the method of the invention will be explained by means of a number of examples in FinFET technology. However, the method of the invention is also applicable to any other MuGFET technology which is or may become known to the person skilled in the art.

Below, a design methodology is presented which takes into account all complex dependencies of both layout and process parameters on the electrical ESD device parameters of FinFET gated diodes and NMOS FinFET devices in both parasitic bipolar and active MOS operation mode. This allows optimization towards a given ESD target (area consumption, parasitic capacitance, leakage current, . . . ) while fulfilling several imposed design constraints. KiloVolt HBM levels in FinFETs are demonstrated meeting the full IC-level ESD requirements.

I. INTRODUCTION

Major challenges lie ahead for the ESD design engineer. According to the International Technology Roadmap of Semiconductors (ITRS) 2007 [1], physical gate lengths of a transistor will reach the size of 9 nm in 2016. Even if lithography and etching techniques can provide these dimensions, bulk CMOS will run into a number of Short Channel Effects (SCE) associated with transistor scaling. New devices start to arise, out of which multi-gate MOSFETs show promising performance [2]. In fact, from ITRS 2005 roadmap onwards, parallel paths are predicted to reflect the most likely scenario: some companies will extend planar bulk CMOS as long as possible. Others will switch to Fully Depleted SOI and/or multiple-gate devices. Eventually, the ultimate MOSFET will be a multiple-gate device. Therefore, its ESD robustness should be preferably considered in the early technology development phase as these evolutions might lead to a 'drastic' reduction in ESD performance.

In [3], the different ESD-device parameters (failure current $It_2$, holding voltage $V_h$, on-resistance $R_{on}$, leakage current and area consumption) of a Grounded-Gate-NMOS FinFET device were investigated as a function of device geometry and process parameters. For N-type FinFETs a comparison was presented between standard grounded-gate configuration and MOS-diode mode where the gate is tied to the drain.

Some process features (e.g. strain, Selective Epitaxial Growth (SEG), . . . ) are imposed by the technology [4], while some process options can be chosen specifically for the ESD protection devices (e.g. Silicide Blocking, well implants, . . . ). Besides such process options, the ESD design engineer can choose the layout parameters to find an optimal ESD layout and design.

A design methodology is needed because the more complex geometry of FinFET devices compared to planar introduces a higher degree of complexity that make optimization absolutely not obvious as compared to planar devices.

Herein, a general design methodology is presented to optimize the layout and process parameters of a given ESD protection device towards a certain design target (area consumption, parasitic capacitance, leakage current, . . . ) while meeting a set of ESD constraints (ESD robustness, leakage current, maximum allowed voltage, maximum allowed voltage overshoot, . . . ).

II. FINFET TECHNOLOGY

In FIG. 1, a top view is shown of a possible layout of a FinFET device, together with the different layout parameters. FinFET devices have more geometrical dimensions than conventional planar devices. In addition to gate length $L_G$, we can also define fin width $W_{fin}$, fin height $H_{fin}$, distance between S/D contact area and gate LSD, size of the S/D contact area $L_{cont}$, distance between two adjacent fins S, overlap gate on fins $W_{ext}$ and number of fins N. $W_{fin}$, $L_G$, LSD, $L_{cont}$ and N can be chosen by the designer. $H_{fin}$, $W_{ext}$ and S are in this example fixed by the process. $L_G$ is 45 nm minimal, $W_{fin}$ 30 nm minimal, S is fixed to 170 nm, LSD is 100 nm minimal and $L_{cont}$ is chosen to accommodate two rows of contacts for all devices presented below.

The devices are processed on SOI-wafers with 65 nm Si film thickness ($H_{fin}$) on top of a 145 nm Buried Oxide (BOX). The gate stack consists of a 100 nm polysilicon on top of a metal gate (TiN), a high-k 2 nm HfSiON layer and 1 nm interfacial oxide. The TiN gate has its workfunction in the middle of the bandgap such that symmetric threshold voltages ($V_T$) for NMOS and PMOS can be achieved without any fin doping. After Ni-silicidation, a tensile Contact Etch Stop Layer (tCESL) layer of 0.8 GPa is used to introduce strain for improved carrier mobility.

More technological details can be found in [5].

III. ESD MEASUREMENTS

Figure 2:
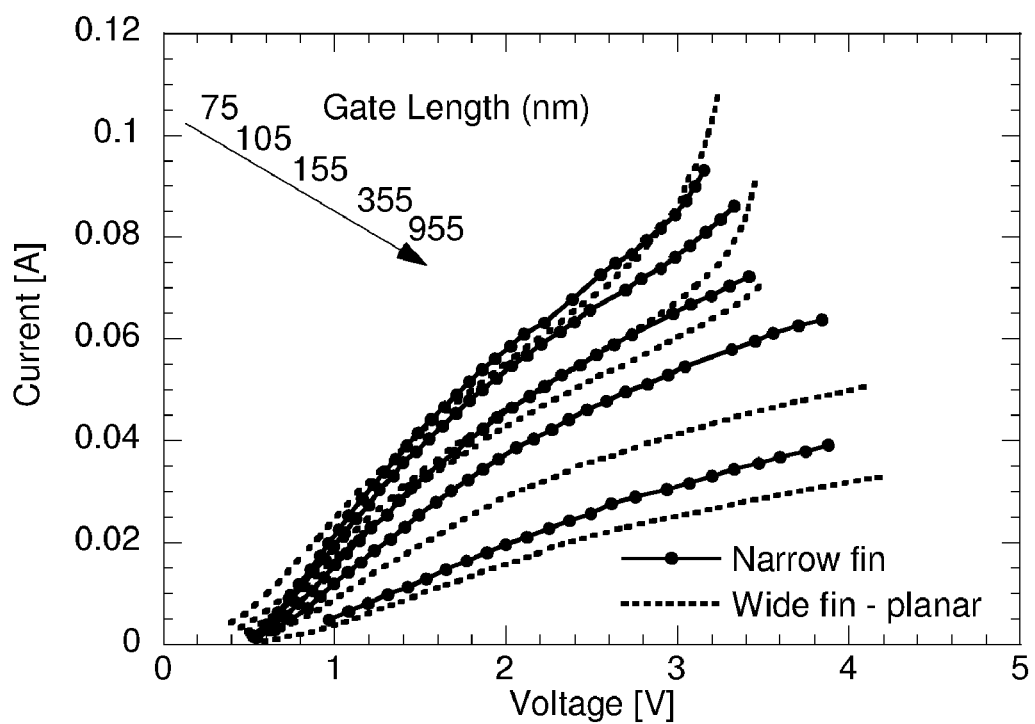
FIG. 2 shows TLP IV curves for different gate lengths of N-type FinFET in MOS diode mode. Solid lines (narrow fin): the devices have a fin width of 30 nm and 400 fins in parallel. Dotted lines (wide fin–planar): the devices have one wide "single fin" of 40 μm.

TLP IV curves for N-type FinFET devices in MOS diode mode as a function of gate length are shown in FIG. 2. TLP IVs in bipolar mode are repeated from [3] in FIG. 3 for clarity reasons and also the influence of gate length and fin width on $It_2$, $V_h$ and $R_{on}$ is described there. Different normalizations were introduced in [3]. The effective silicon width was defined as $N*W_{fin}$, whereas the total layout size took into account the fin-to-fin spacing S. The TLP measurements were done with 100 ns pulse width and 2 ns rise time.

Figure 3:
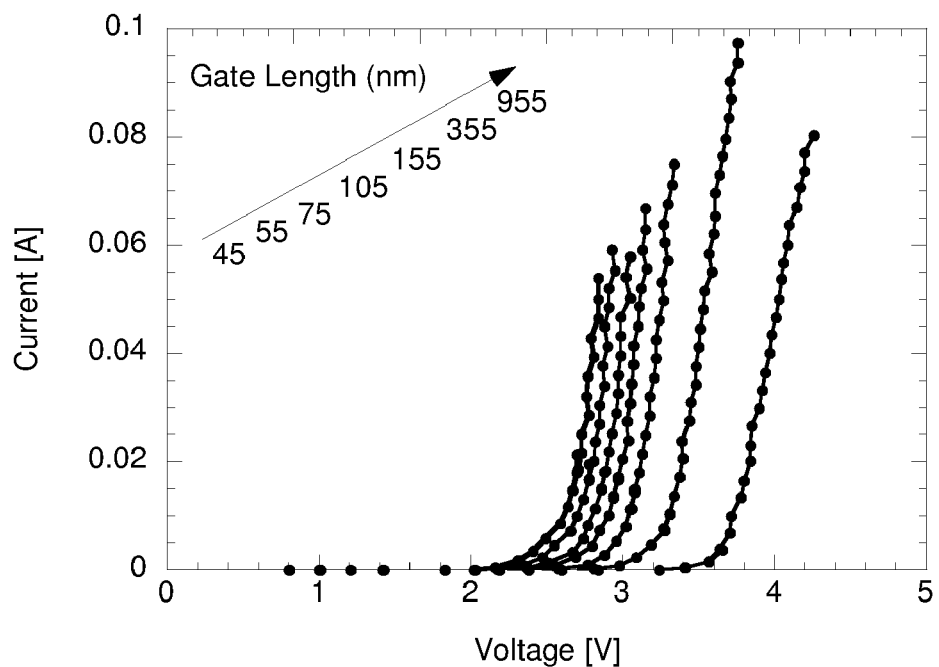
FIG. 3 shows TLP IV curves for different gate lengths of N-type FinFET in bipolar mode. The devices have a fin width of 30 nm and 400 fins in parallel. The effective silicon width is 12 μm.

Different trends are seen when comparing the NMOS FinFET IV curves in MOS diode mode (FIG. 2) and bipolar mode (FIG. 3). $It_2$ decreases monotonically with increasing $L_G$ for the diode mode, whereas it increases for the bipolar mode to an optimum. The MOS-diode starts to significantly conduct soon after the threshold voltage $V_T$ is reached. For narrow fin devices, the fin is fully depleted and hence $V_T$ is defined only by the workfunction of the metal gate. Therefore, no influence of $L_G$ on $V_T$ is seen (FIG. 2 solid lines). For wide fin (planar) devices (FIG. 2 dotted lines) for small gate lengths, a $V_T$ roll-off is seen because of loss of SCE control. For the MOS diode mode, $R_{on}$ is not constant. The IV curves deviate from the linear behavior due to self-heating at higher current levels and for small gate lengths also bipolar conduction is seen at the highest current levels.

Figure 4:
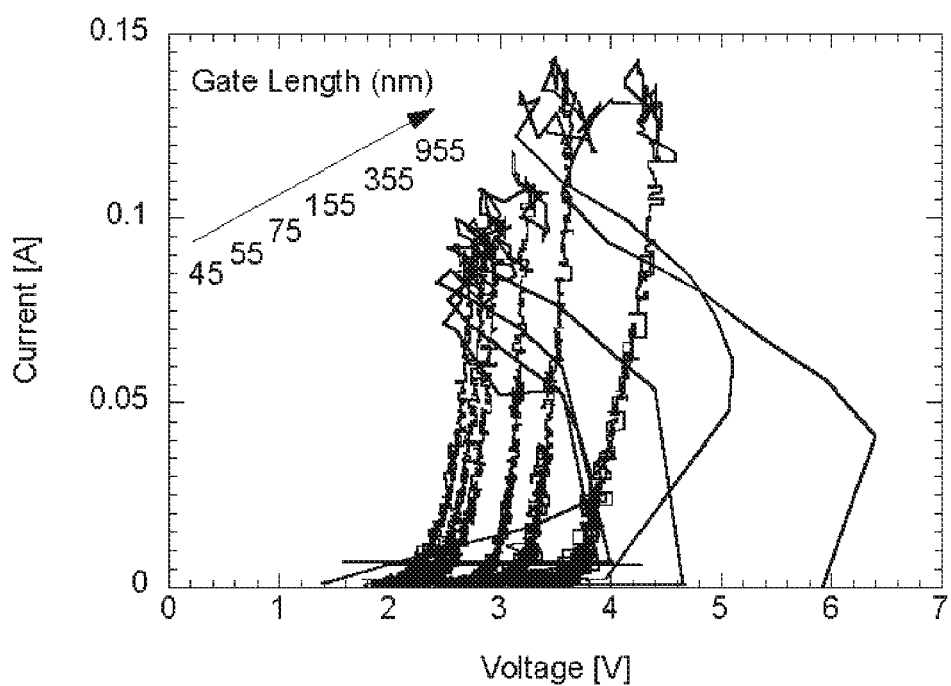
FIG. 4 shows HBM IV curves for different gate lengths of N-type FinFET in bipolar mode. The devices have a fin width of 30 nm and 400 fins in parallel. The effective silicon width is 12 μm.

Up to now, only TLP measurements where shown on relative small devices yielding failure current levels of only a few hundred mA's which is far off IC-level ESD currents. Therefore, scaling needs to be checked into the ampere-range and the correlation between TLP and HBM needs to be investigated. FIG. 4 shows calibrated HBM IV curves of the same set of devices as was measured with TLP (FIG. 3). The HBM measurements where done according to [6] with a voltage resolution of 10 V. With HBM, the exact same trends can be observed as with TLP and as such, the design methodology can be applied to predict HBM results. Table 1 shows HBM measurement results on 'large' NMOS devices in bipolar mode comprising many parallel fins placed in different parallel blocks. HBM results of up to 3.4 kV are obtained in a FinFET device for the first time. The HBM failure voltage (VHBM) normalized per effective silicon width decreases with increasing $W_{fin}$ as was also obtained from TLP $It_2$ measurements. A correlation ratio of roughly 1.5 kV/A is measured between HBM and TLP. No problems with non-uniformity issues were noticed, even for these very large devices, demonstrating the full scalability of these FinFETs.

TABLE 1

Measured HBM results on 'large' NMOS FinFET devices in bipolar mode.

| $L_g$ [nm] | $W_{fin}$ [nm] | Number of fins × number of rows | $V_{HBM}$ [kV] | $V_{HBM}$ [V/μm] |
|---|---|---|---|---|
| 75 | 30 | 400 × 8 | 1 | 10.4 |
| 75 | 30 | 400 × 16 | 2.4 | 12.5 |
| 75 | 75 | 400 × 16 | 2.7 | 5.6 |
| 75 | 155 | 400 × 16 | 3.4 | 3.1 |
| 75 | 40000 | 1 × 16 | 2 | 3.1 |

IV. DESIGN METHODOLOGY

In this section a specific example applying our design methodology is presented. The methodology is used to find the minimum-area solution of a MOS clamp operating either in bipolar or in active MOS mode. In both cases it is required to sustain a certain HBM ESD stress, while meeting a given leakage specification and without exceeding a certain maximum voltage $V_{max}$, which could be for example the gate oxide breakdown voltage. Because of the different nature of the dependencies of the electrical ESD parameters in bipolar and MOS diode mode, both modes are treated in separate subsections. In a third subsection, gated diodes are discussed since they are one of the basic ESD protection devices.

A. Bipolar Mode (1$^{st}$ Example)

The impact of $W_{fin}$ and $L_G$ on the different ESD device parameters for the NMOS devices in bipolar mode are summarized in Table 2. A "+" indicates behavior beneficial for ESD, whereas a "−" indicates a detrimental effect. Two different normalizations are used for $It_2$ as in [3]. The effective silicon width does not include the fin-to-fin spacing (parameter S in FIG. 1), whereas the total layout width does.

TABLE 2

Summary of different device parameters as a function of layout parameters $L_G$ and $W_{fin}$ for grounded gate NMOS devices in bipolar mode. "+" is beneficial for ESD, whereas "−" is detrimental.

| | Short gate length | Long gate length |
|---|---|---|
| Narrow fin | +Low $V_h$<br>+Low $R_{on}$<br>+Low leakage<br>+High $It_2$/eff. silicon width<br>−Low $It_2$/layout size | Medium $V_h$<br>Medium $R_{on}$<br>+Low leakage<br>+High $It_2$/eff. silicon width<br>−Low $It_2$/layout size |
| Wide fin | +Low $V_h$<br>Medium $R_{on}$<br>−High leakage<br>Medium $It_2$/eff. silicon width Medium $It_2$/layout size | −High $V_h$<br>−High $R_{on}$<br>+Low leakage<br>Medium $It_2$/eff. silicon width<br>Medium $It_2$/layout size |

Figure 5:
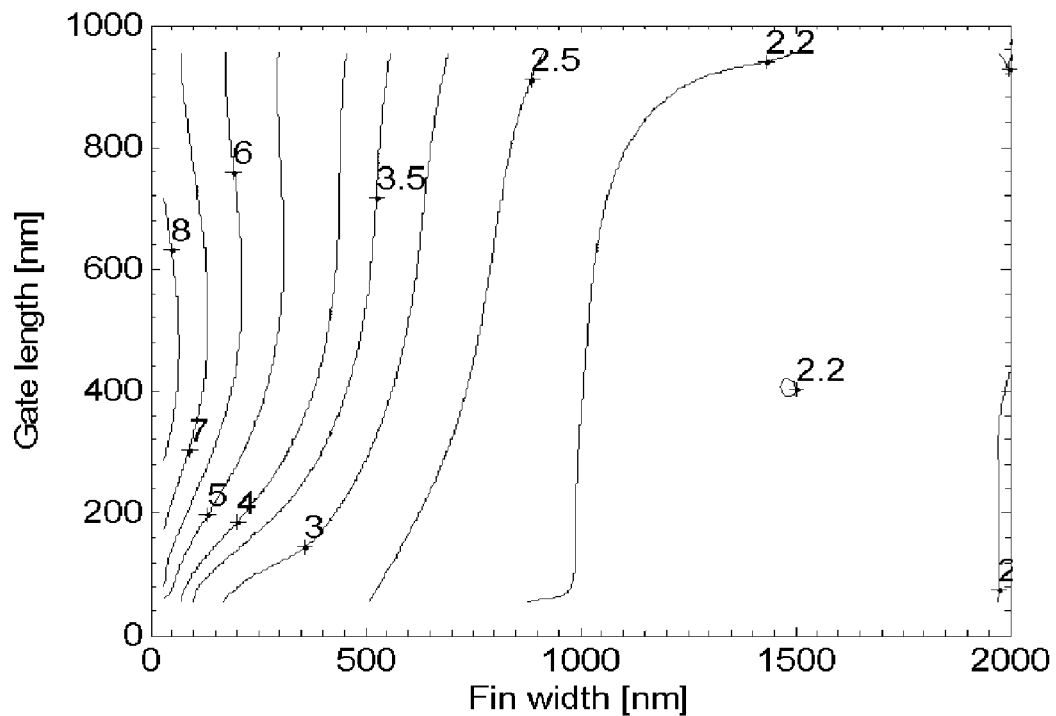
FIG. 5 shows a contour plot of normalized failure current $It_2$ in bipolar mode per effective silicon width [mA/μm] as a function of gate length and fin width.

Based on available measurement data ($L_G$ and $W_{fin}$ variations) $It_2$, $V_h$ and $R_{on}$ are calculated over the full $L_G$-$W_{fin}$ design space using a triangle-based interpolation method. This allows estimating $It_2$, $V_h$ and $R_{on}$ values for any given $L_G$-$W_{fin}$ point. FIG. 5 shows a contour plot of $It_2$, normalized per effective silicon width, over the $L_G$-$W_{fin}$ design space. At large $W_{fin}$, $It_2$ saturates around 2 mA/μm.

Figure 6:
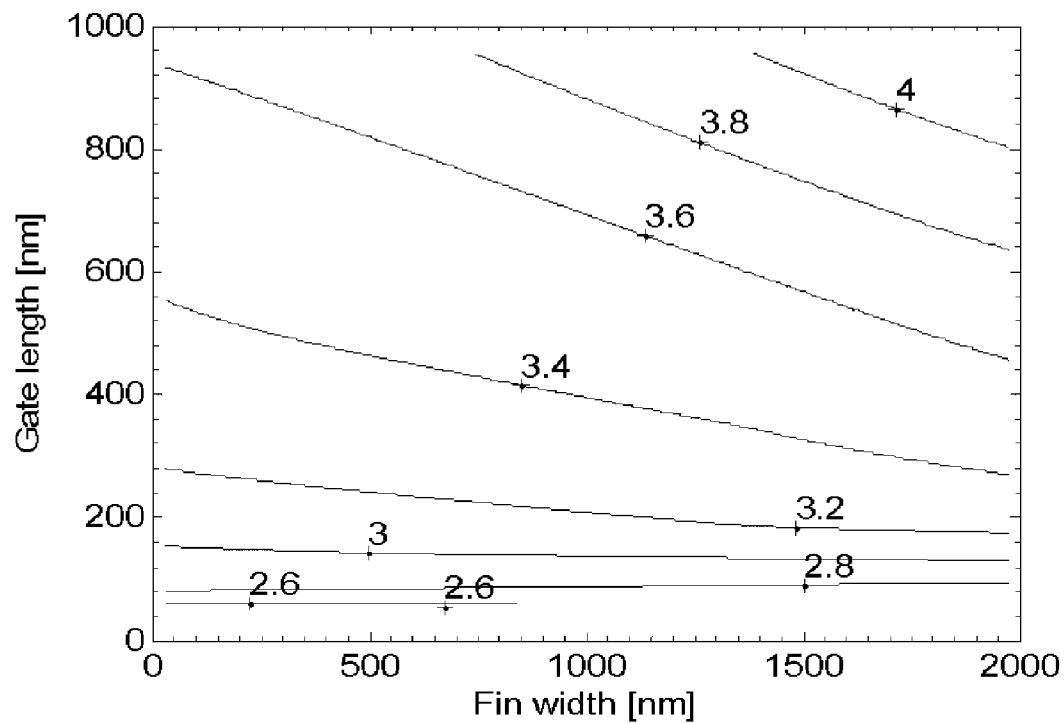
FIG. 6 shows holding voltage $V_h$ [V] contours in bipolar mode as a function of gate length and fin width.
Figure 7:
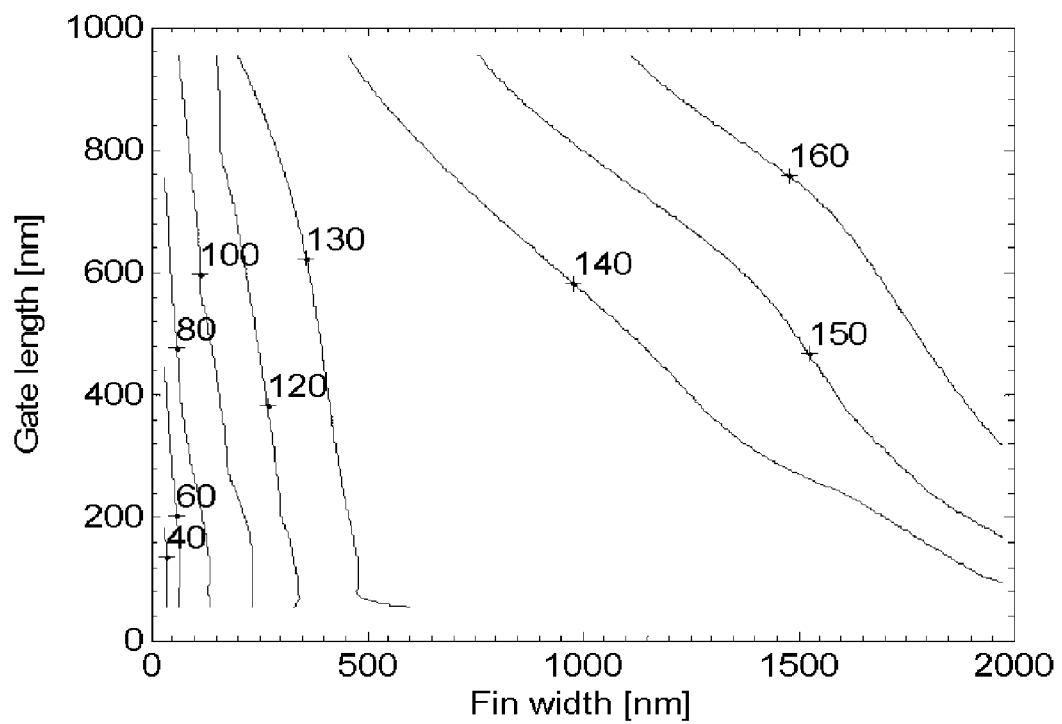
FIG. 7 shows the normalized on-resistance $R_{on}$ contours in bipolar operation mode per effective silicon width [Ωμm] as a function of gate length and fin width.

Contour plots of $V_h$ and $R_{on}$ normalized per effective silicon width are shown in FIG. 6 and FIG. 7 based on the data originally presented in [3].

The methodology starts with selecting the number of fins N needed to meet a given ESD robustness specification. N is calculated for each $L_G$-$W_{fin}$ point based on the normalized $It_2$ graph (FIG. 5).

Figure 8:
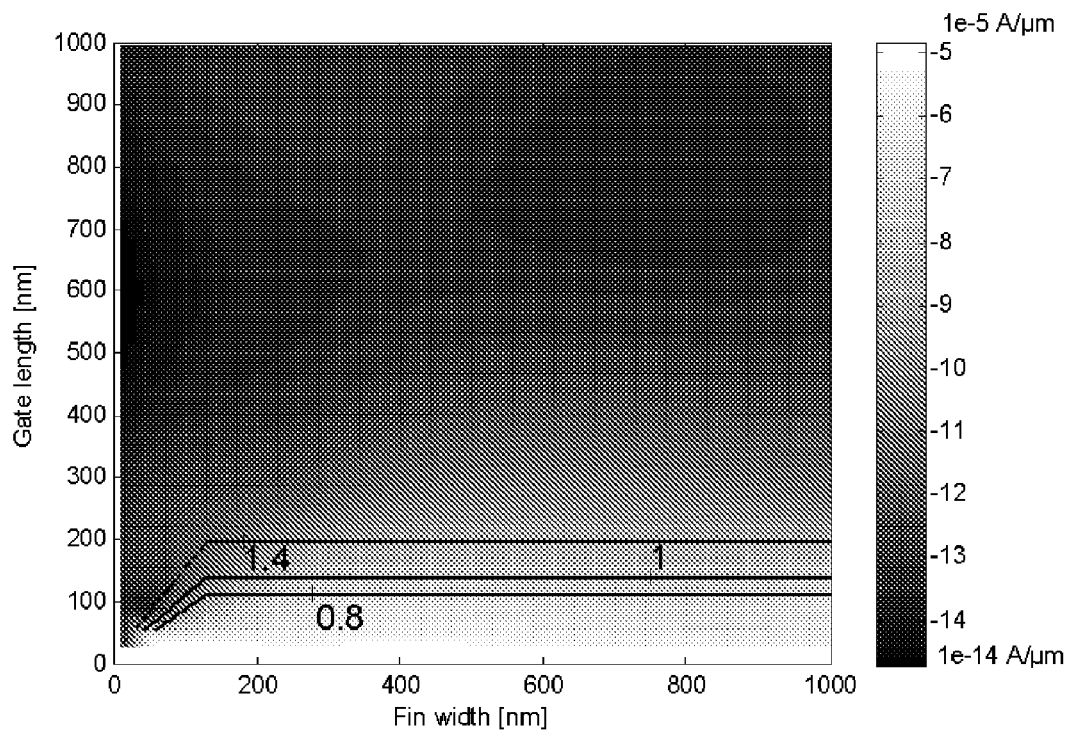
FIG. 8 shows a logarithmic of leakage current [A/μm] normalized towards total channel width $N(W_{fin}+2H_{fin})$. Formula (I) for the Short Channel Control (SCC) is overlaid to shown the validity of the formula.

To calculate N, the methodology starts with selecting the set of devices (specific $W_{fin}$-$L_G$ combinations) which meet the leakage specification. Leakage qualification is done based on an empirical formula:

$$SCC = \frac{L_G}{\min(W_{fin}, 2H_{fin}) + 6EOT} \quad (1)$$

where Short Channel Control (SCC) is calculated as a function of $L_G$, $W_{fin}$ and equivalent oxide thickness (EOT). SCC>1.4 is considered as a safe device, $1.4 \geq SCC \geq 1$ has still good short channel control, while devices with SCC<1 suffer from strong SCE. This formula provides an easy way to take into account the leakage behavior of a device with certain $L_G$ and $W_{fin}$. This formula was preferred over actual measurement data because a lot of variation in leakage current was measured due to the presence of parasitic Schottky contacts [7]. These Schottky contacts are a result of over-silicidation of the drain to body junction and are present because the process was still under development. Devices with too high initial leakage would consequently have a low ESD robustness, and hence are not considered. By adding Selective Epitaxial Growth (SEG), the problem of over-silicidation is greatly reduced [8] and less spread on the results was measured. The results of formula (I) are overlaid with the logarithmic of the leakage current [A/μm] of a wafer with SEG, normalized to total channel width $N(W_{fin}+2H_{fin})$ in FIG. 8. A clear correlation can be observed, proving the validity of the formula.

Secondly, for each $L_G$-$W_{fin}$ point, the number of fins N needed to meet a given ESD robustness specification is calculated using the normalized $It_2$ graph (FIG. 5).

In a third step, the voltage drop ($V_{drop}$) over the device during maximum ESD current is calculated using:

$$V_{drop} = V_h + I_{ESD} R_{tot} < V_{max} \quad (2)$$

where $R_{tot}$ represents the total resistance of the device. $V_{drop}$ has to remain below the maximum allowed voltage in the application $V_{max}$ and the number of fins N can be increased to reduce $R_{tot}$ when necessary. In a similar fashion, the trigger speed of the protection device can be included in the optimization as well, by imposing a second limit for the maximum transient voltage overshoot.

In a fourth step, the total necessary device area is then calculated as:

$$\text{Area} = (NW_{fin} + (N-1)S + 2W_{ext})(L_g + 2L_{SD} + 2L_{cont}) \quad (3)$$

The lowest area device in the design space is selected as the optimum solution for the given constraints.

Figure 9:
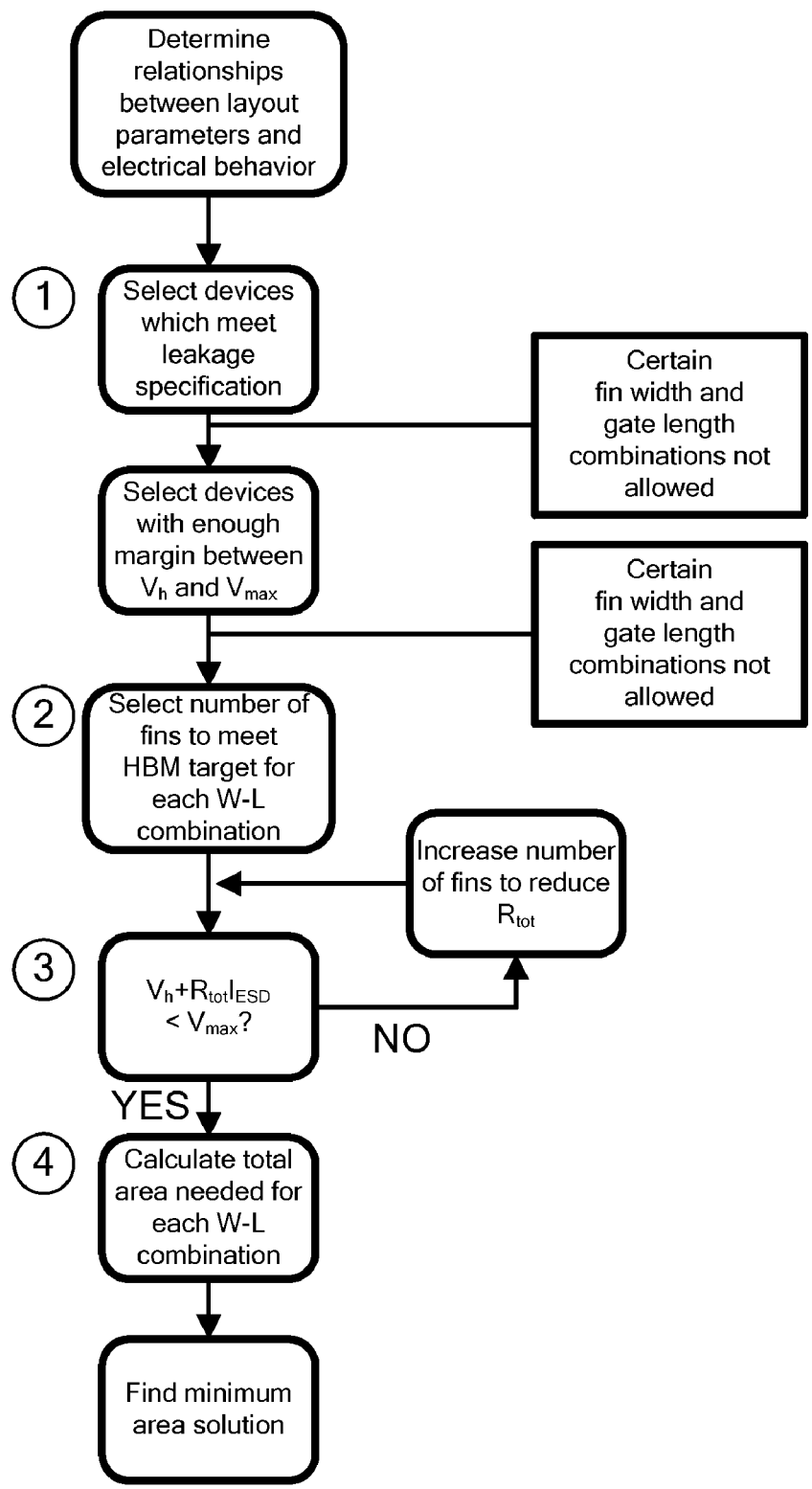
FIG. 9 shows a block diagram showing the different steps of the design methodology for the specific example used.

A block diagram schematic of the methodology is shown in FIG. 9 for this specific example where the different steps are summarized.

Figure 20:
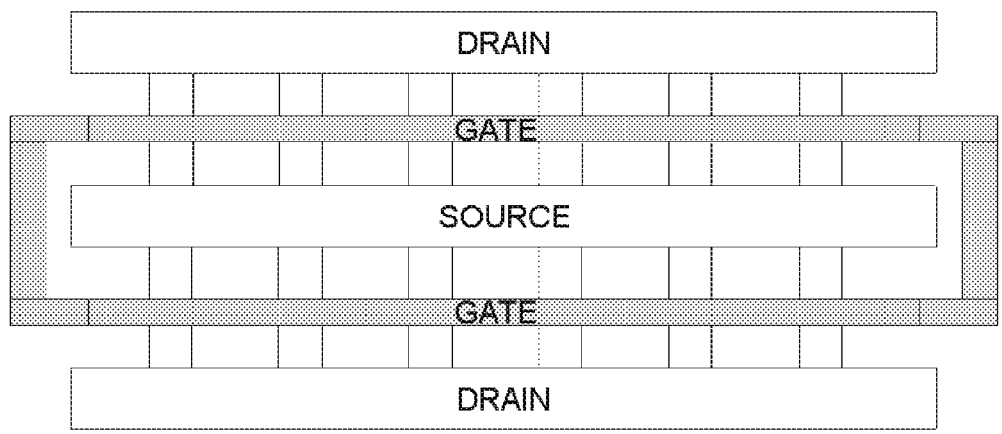
FIG. 20 shows a top layout view of a FinFET device with a folding factor of 2, optimisable according to the invention.

Also, folding of the transistor by sharing source and drain areas could be implemented to reduce the overall area. An example of such device is shown in FIG. 20, with a number of fingers=folding factor=2, a number of fins per finger=6, so a total number of fins=6*2=12. The impact of folding on the ESD performance parameters, such as $It_2$ and $R_{on}$ can be studied. $It_2$ and $R_{on}$ may be impacted by constraints in the metal wiring and/or accumulative heating of folded structures. As such, the folding factor becomes an additional layout parameter which can be easily included in the design methodology.

As an example, this design methodology can be used to determine the minimum area solution for a GGNMOS device with an ESD capability of 1 kV HBM, $V_{max}$ of 4 V during ESD and low leakage current (i.e. SCC>1.4). The required area is calculated using (3) for each point in the $L_G$-$W_{fin}$ design space taking into account the correlation factor of 1.5 kV/A between HBM and TLP. The optimal solution is the point in the $L_G$-$W_{fin}$ design space with the smallest required area.

Figure 10:
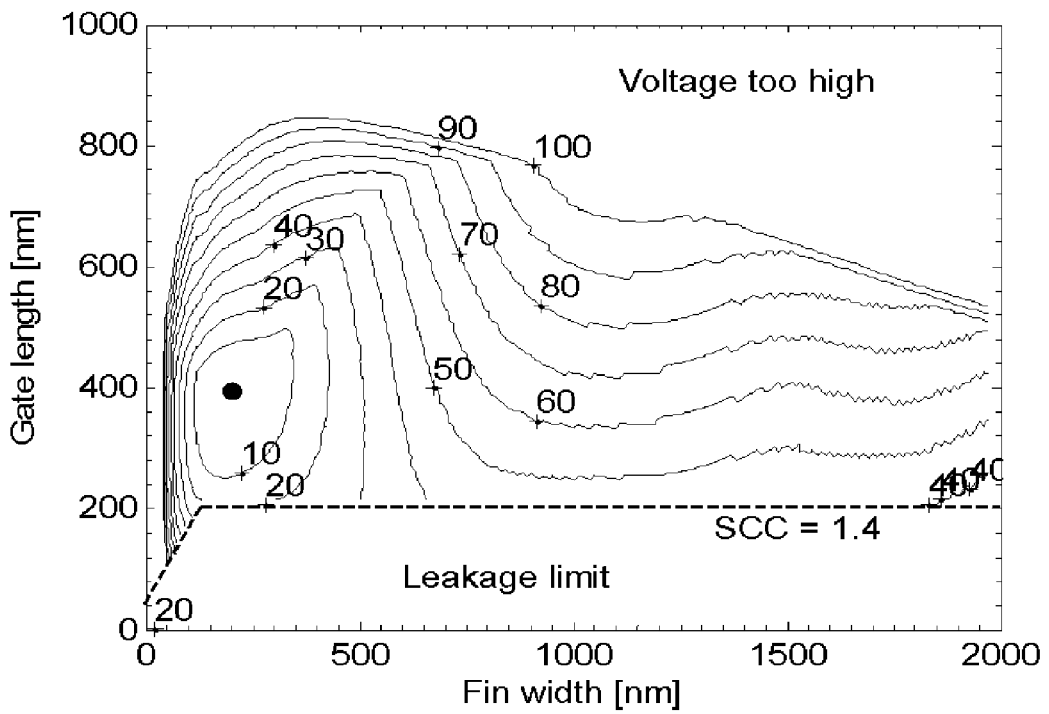
FIG. 10 shows the percentage of increased area over optimal solution (dot) which meets imposed design constraints of 1 kV HBM, 4 V $V_{max}$ and excellent short-channel control (SCC>1.4) in bipolar mode.

FIG. 10 shows the percentage of area increase for the full $L_G$-$W_{fin}$ design space over the optimal solution, which is indicated by the dot and has 395 nm $L_G$ and 200 nm $W_{fin}$, corresponding to a consumed area of 296 μm². It is clear that any $L_G$ or $W_{fin}$ deviation from the optimum leads to a drastic increase in the required area. No solutions exist for small $L_G$ because of the leakage current limitation and for large $L_G$ because of too high voltage drop.

Figure 11:
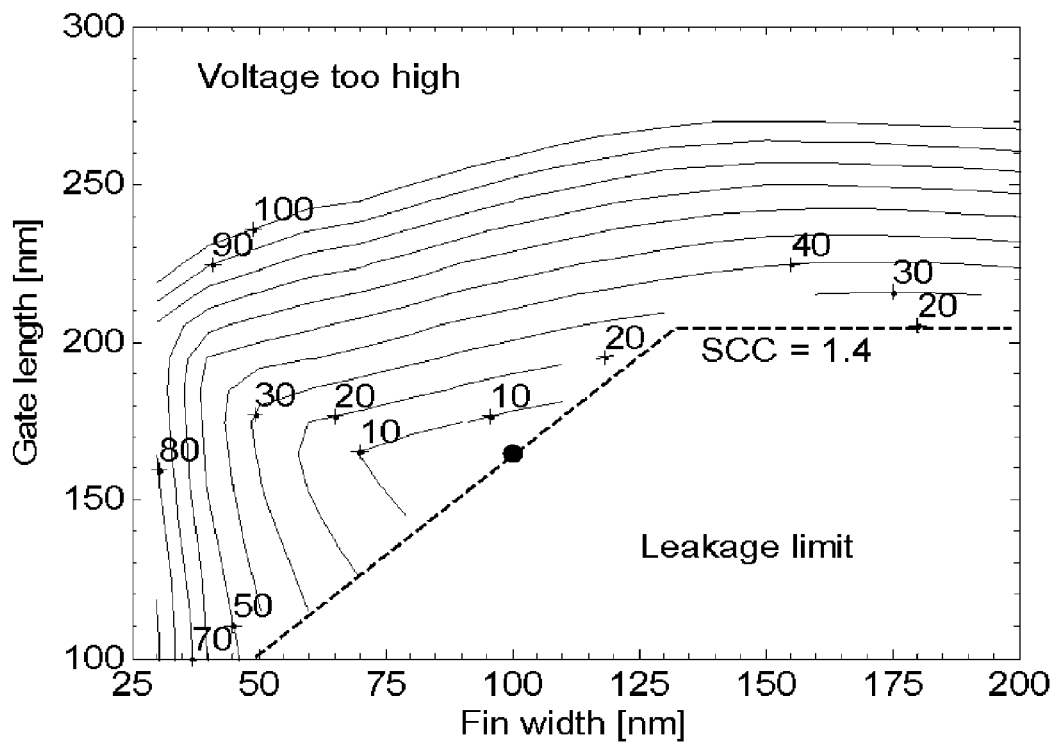
FIG. 11 shows the percentage of increased area over optimal solution (dot) which meets imposed design constraints of 1 kV HBM, 3.4 V $V_{max}$ and excellent short-channel control (SCC>1.4) in bipolar mode.

When the allowed voltage is for example decreased from 4 V to 3.4 V, the optimum solution shifts to lower $L_G$ (165 nm) because of a lower required $V_h$. As a consequence, also $W_{fin}$ (100 nm) has to be reduced for SCC, as seen in FIG. 11. This solution is limited by the leakage current limit and results in an increased area consumption of 40%, namely 417 μm².

B. MOS Diode Mode (2$^{nd}$ Example)

Figure 12:
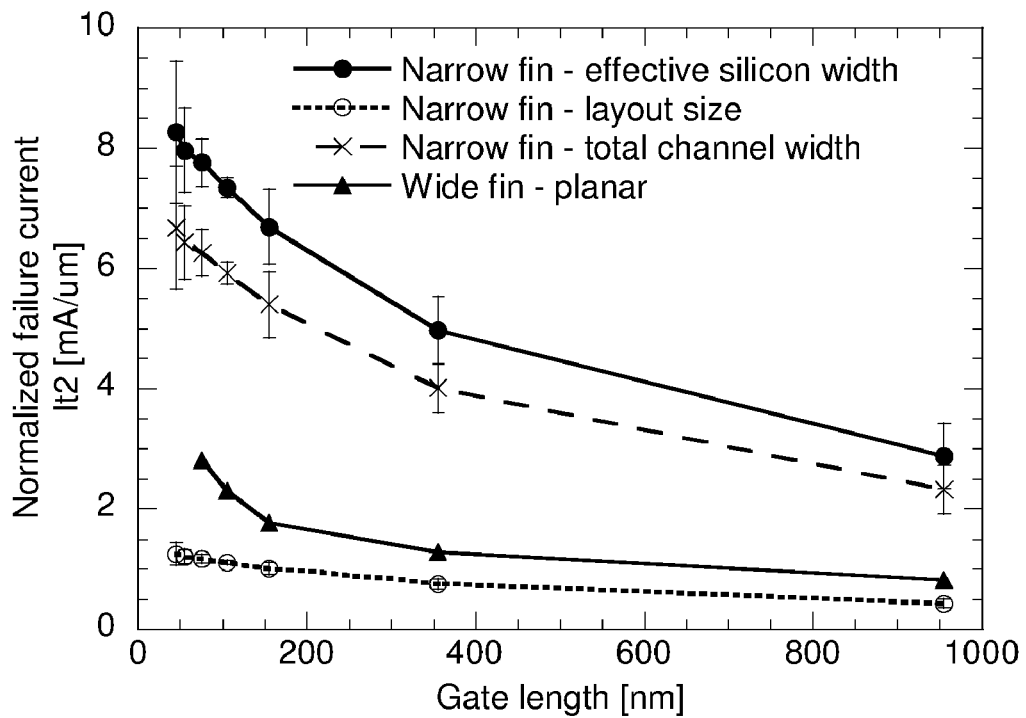
FIG. 12 shows the normalized measured $It_2$ as a function of gate length for N-type FinFET devices in MOS diode mode, for narrow fin devices of 30 nm fin width and 400 parallel fins and for wide fin devices of a single 40 μm fin.

The impact of $L_G$ on $It_2$ for the NMOS in diode mode (gate connected to drain versus source) is shown in FIG. 2 and FIG. 12 for both narrow and wide fins. Because the NMOS device operates in active mode, an additional normalization is added to take into account the total channel width. $It_2$ decreases monotonically with increasing $L_G$. Note that for wide fin devices, all three normalizations yield roughly the same value.

Figure 13:
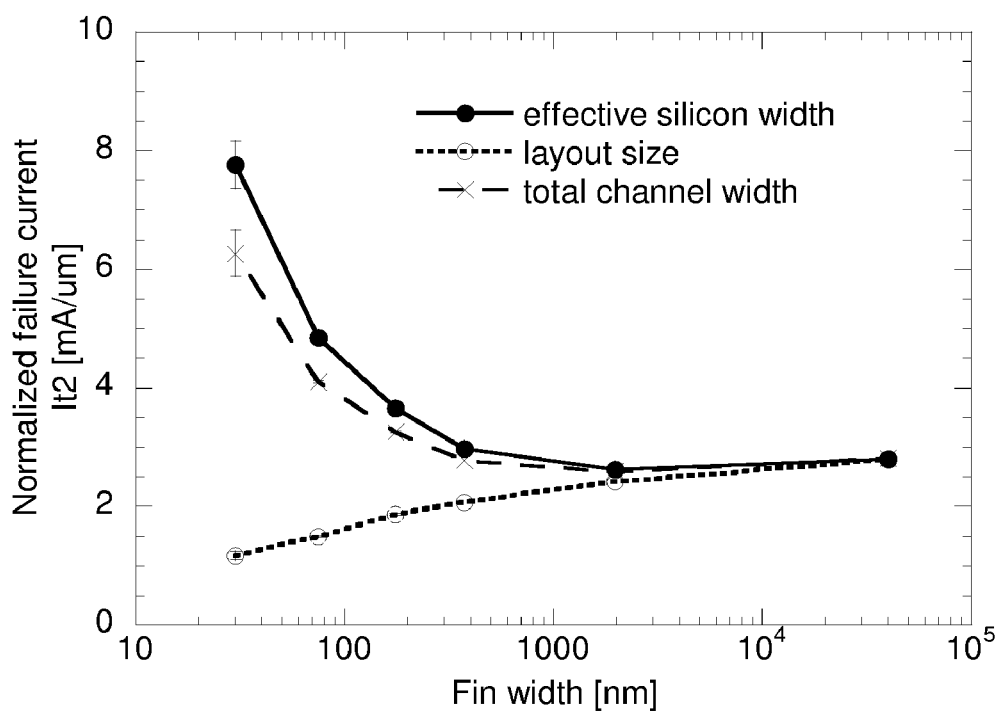
FIG. 13 shows the normalized measured $It_2$ as a function of fin width for N-type FinFET devices with gate length of 75 nm in MOS diode mode.
Figure 14:
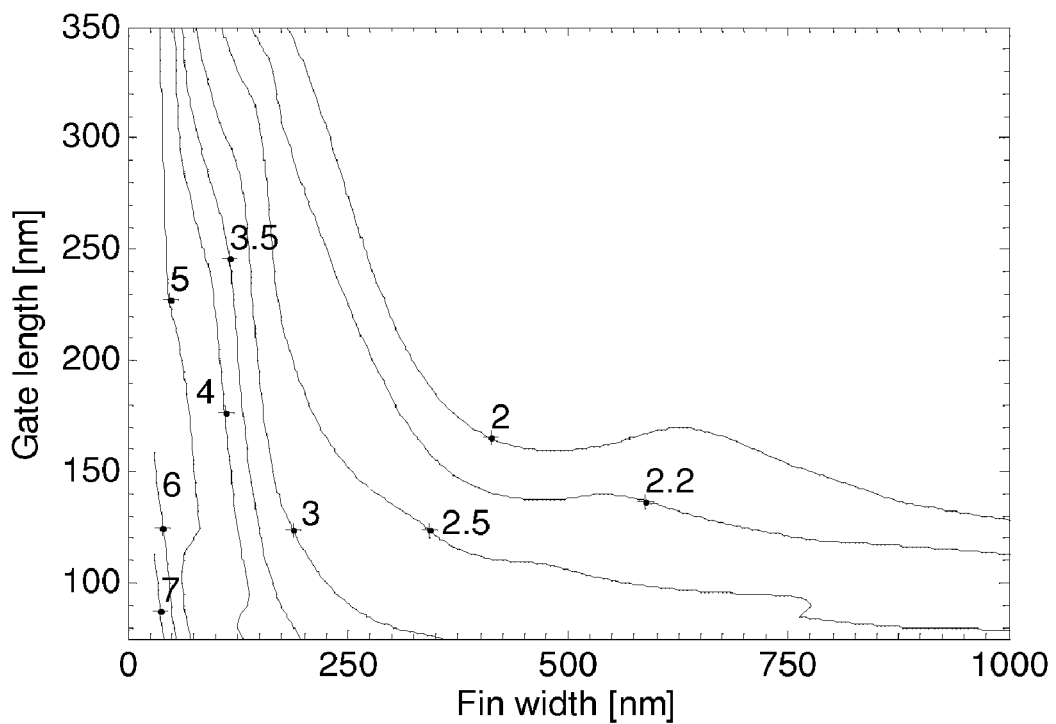
FIG. 14 shows a contour plot of normalized failure current $It_2$ per effective silicon width [mA/μm] as a function of gate length and fin width in MOS diode mode.

Narrow fin devices are less area effective than wide fin devices as can be also seen in FIG. 13 where $It_2$ is shown as a function of fin width. Similar as in bipolar mode, narrow fin devices in MOS diode mode have higher $It_2$ per effective silicon width due to better cooling of the fins than wide fin devices. The contour plot of $It_2$ normalized per effective silicon width is shown in FIG. 14.

$V_T$ is largely independent of $L_G$ and of $W_{fin}$ and its value is about 0.5 V for narrow-fin devices as seen from FIG. 2. On the contrary, for wide fin devices $V_T$ decreases with short gate lengths, thus these devices have poor control of SCE and hence cannot be used. $R_{on}$-extraction in diode mode is more difficult than in bipolar mode due to the non-linear current behavior (FIG. 2). For the presented methodology, a non-physical linear $R_{on}$ was extracted between $V_T$ and $Vt_2$ to obtain correct $Vt_2$-values at $It_2$ current level. A more complex function could be implemented as well. Table 3 summarizes the different dependencies.

TABLE 3

Summary of different device parameters as a function of layout parameters $L_G$ and $W_{fin}$ for NMOS devices in MOS diode mode.
"+" is beneficial for ESD, whereas "−" is detrimental.

| | Short gate length | Long gate length |
| --- | --- | --- |
| Narrow fin | +Low leakage<br>Medium $R_{on}$<br>+High $It_2$/eff. silicon width<br>−Low $It_2$/layout size | +Low leakage<br>−Large $R_{on}$<br>Medium $It_2$/eff. silicon width<br>−Low $It_2$/layout size |

TABLE 3-continued

Summary of different device parameters as a
function of layout parameters $L_G$ and $W_{fin}$ for
NMOS devices in MOS diode mode.
"+" is beneficial for ESD, whereas "−" is detrimental.

|  | Short gate length | Long gate length |
|---|---|---|
| Wide fin | −High leakage<br>Medium $R_{on}$<br>Medium $It_2$/eff. silicon width<br>Medium $It_2$/layout size | +Low leakage<br>−Large $R_{on}$<br>−Low $It_2$/eff. silicon width<br>−Low $It_2$/layout size |

In order to study active clamp MOSFETs, the TLP IV-curves of FIG. 2 could be limited up to the point of onset of self-heating. This then yields a new $It_2$-value and corresponding linear extracted $R_{on}$ to be used in the methodology.

Figure 15:
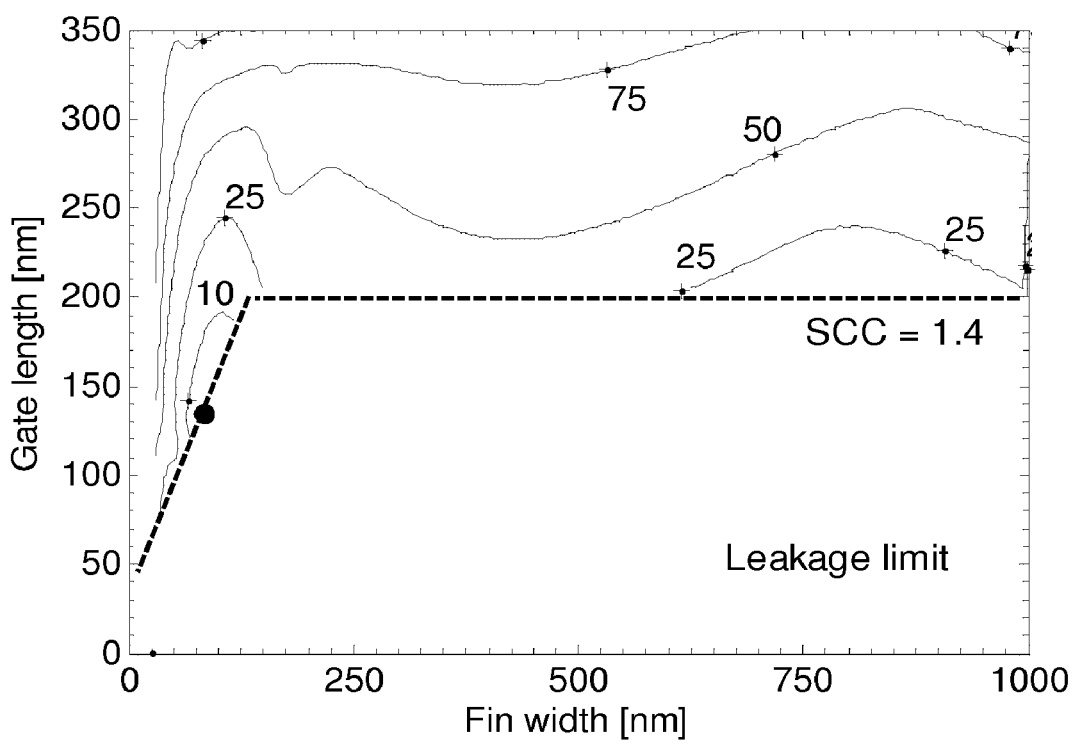
FIG. 15 shows the percentage of increased area over optimal solution (dot) which meets imposed design constraints of 1 kV HBM, 4 V $V_{max}$ and excellent short-channel control (SCC>1.4) in MOS diode mode.
Figure 16:
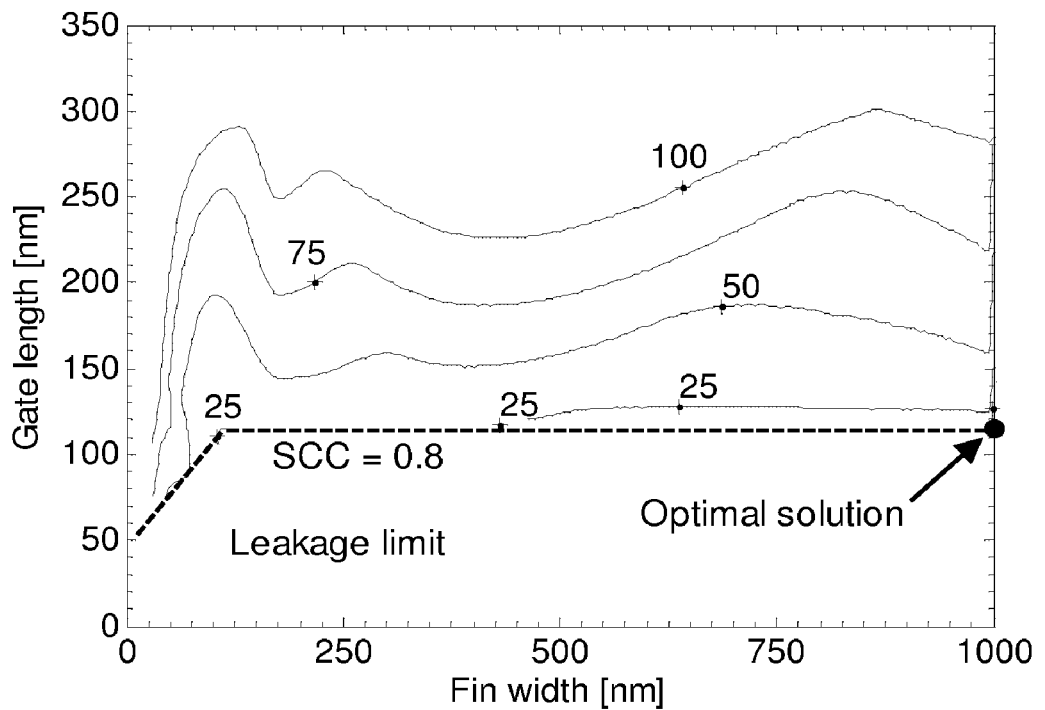
FIG. 16 shows the percentage of increased area over optimal solution (dot) which meets imposed design constraints of 1 kV HBM, 4 V $V_{max}$ but without short-channel control (SCC=0.8) in MOS diode mode.

Using these results, the design methodology can be used to optimize towards area in a similar fashion as for the bipolar mode. From these results, one might intuitively but wrongly think, based on FIG. 12 and FIG. 13, that the best device in MOS diode mode is a wide fin transistor with a minimum gate length which just fulfills the leakage requirements, eq. (1). Using constraints of 1 kV HBM, 4 V $V_{max}$ and SCC>1.4, it can be calculated that this device would have 200 nm $L_G$ and would use 578 μm². However, when applying the methodology, the optimal solution turns out to be a device with N=1582 fins of 90 nm $W_{fin}$ and 145 nm $L_G$ as can be seen in FIG. 15. It uses an area of only 470 μm², which is roughly a 20% reduction compared to the intuitive solution. This 20% reduction can be explained by the fact that because of the increased gate length needed for SCC on wide fin devices (FIG. 12), $It_2$ drops down rapidly and hence devices with narrower fins can become more area efficient. When this leakage constraint is removed (e.g. SCC=0.8) the optimal solution found is indeed as was first predicted (FIG. 16).

When comparing the results of the MOS diode with the bipolar operation mode, the MOS diode seems to be less sensitive to a deviation from the optimal $W_{fin}$ and $L_G$. However, the overall performance of the MOS diode is not superior to the bipolar mode, which is generally the case. This can be attributed to the relative high $R_{on}$ as seen in FIG. 2, which can be explained by the absence of a P+-body contact. In fact, when considering the example used above, the MOS diode mode requires an area increase of 58% over the bipolar mode to reach the same ESD target specifications. This has an important consequence, namely that in some cases, the MOS diode mode would become the limiting factor when compared to the bipolar mode. In practice, this would mean that a separate reverse gated diode would be preferred in conjunction with the MOS in bipolar mode.

C. Gated Diodes (3$^{rd}$ Example)

Figure 17:
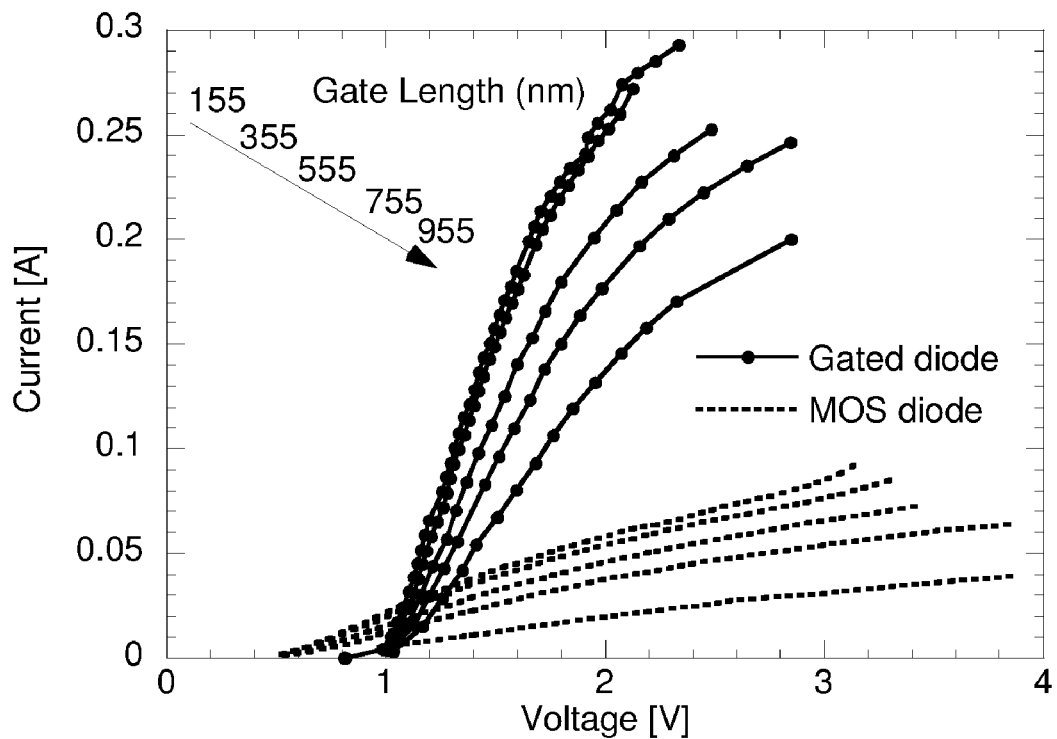
FIG. 17 shows TLP IV curves for different gate lengths of gated diodes in comparison with MOS diode mode. The devices have a fin width of 30 nm and 400 fins in parallel. Cross-section of the two diode types are shown.

TLP IV curves of gated diodes as a function of $L_G$ are compared in FIG. 17 with the MOS diode mode. It is clear that gated diodes exhibit an improved $It_2$ and $R_{on}$, which is optimal for smallest $L_G$. Note that the gate lengths used for the gated diodes are larger than for the MOS devices (see FIG. 2) to accommodate for the N+ and P+ doping on the gate.

Figure 18:
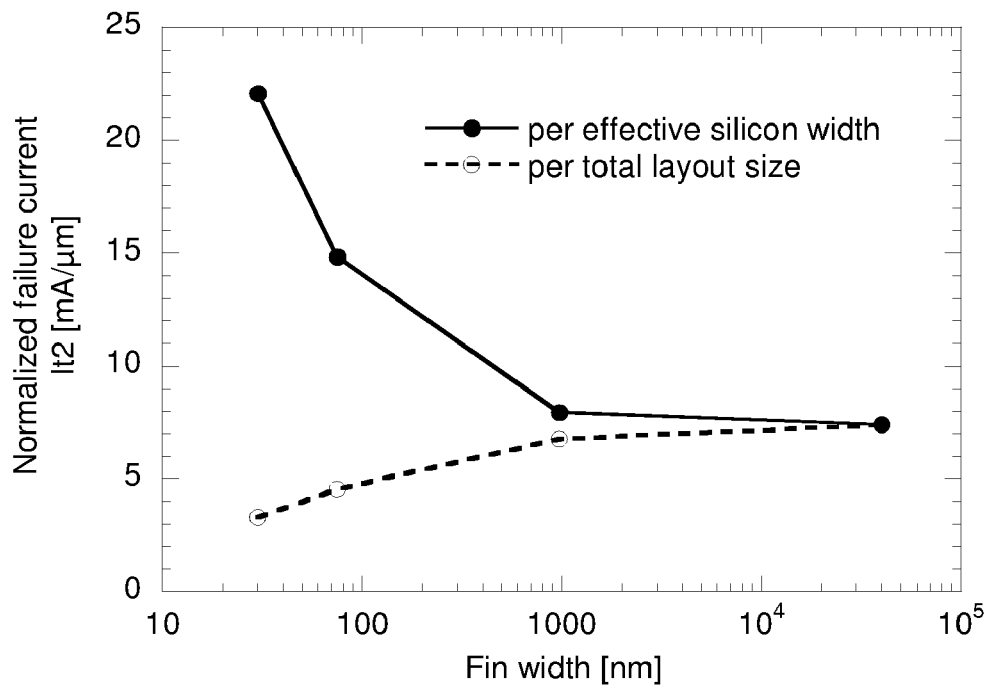
FIG. 18 shows the normalized measured $It_2$ as a function of fin width for gated diodes with 555 nm gate length.

When increasing $W_{fin}$, $It_2$ normalized per effective silicon width decreases while it increases when considering layout (FIG. 18), similarly as for the MOS diode mode. Since leakage current is not a parameter to be considered for gated diodes, the minimum area solution is simply a wide fin diode with the smallest gate length possible. Using this current set of dependencies of layout and process parameters on the ESD performance parameters of gated diodes, no trade-offs seem to be present. This means that at this moment, the stringent flow according to FIG. 9 of the design methodology is not needed for this type of device.

Also the parasitic capacitance of the gated diode is an important parameter when used in high-speed or RF applications. For these applications, area might be less of a concern and the question is whether the 2-3 times improved intrinsic ESD performance observed for narrow fin devices compared to wide fin devices (FIG. 18) results in an improved Figure Of Merit (FOM) for RF when considering capacitance as well. The FOM to be considered is $It_2$ per capacitance [mA/fF]. RF S-parameter measurements were performed on two available gated diodes in RF configuration. The first one consisted of 400 fins of 20 nm wide and gate length of 80 nm, while the second one was a single wide (planar) fin device of same gate length and 80 μm width. The devices were processed with SEG in IMECs 300 mm fab. The measured capacitances were 20 fF and 32.5 fF respectively after de-embedding of the metal interconnects resulting in a FOM of 11.5 mA/fF for the narrow fin device and 33.4 mA/fF for wide fin (i.e. planar) diode. This means that when considering parasitic capacitance as an optimization goal, also the wide fin (planar) gated diode is the preferred option. The gate was left floating, yielding a lower capacitance than when connected to anode or cathode.

To understand these results, formula (4) was derived.

$$C_{tot}[fF] = C_j N(WH_{fin}) + C_{oh} N(W+2H) \quad (4)$$

The total device capacitance $C_{tot}$ is divided into two parts. One part equals the junction capacitance $C_j$ from anode to cathode which is proportional to the junction cross-section $N_{fin}(W_{fin}*H_{fin})$. This part of the total capacitance is therefore directly proportional to the intrinsic ESD robustness of the diode. The second part $C_{oh}$ represents the overhead capacitance proportional to the total gate width $N_{fin}(W_{fin}+2H_{fin})$ and consists of gate overlap and fringing capacitance between the fins and gate [9].

Equation (4) consists of two unknowns, namely $C_j$ and $C_{oh}$, and they can be found by solving a set of equations for both the narrow and wide fin devices (see Appendix). For the narrow fin device, $C_{oh}$ consists of almost 97% of the total device capacitance due to the large fringing capacitances between the fins and gate, while the 'useful' capacitance $C_j$ is only 3%.

Figure 19:
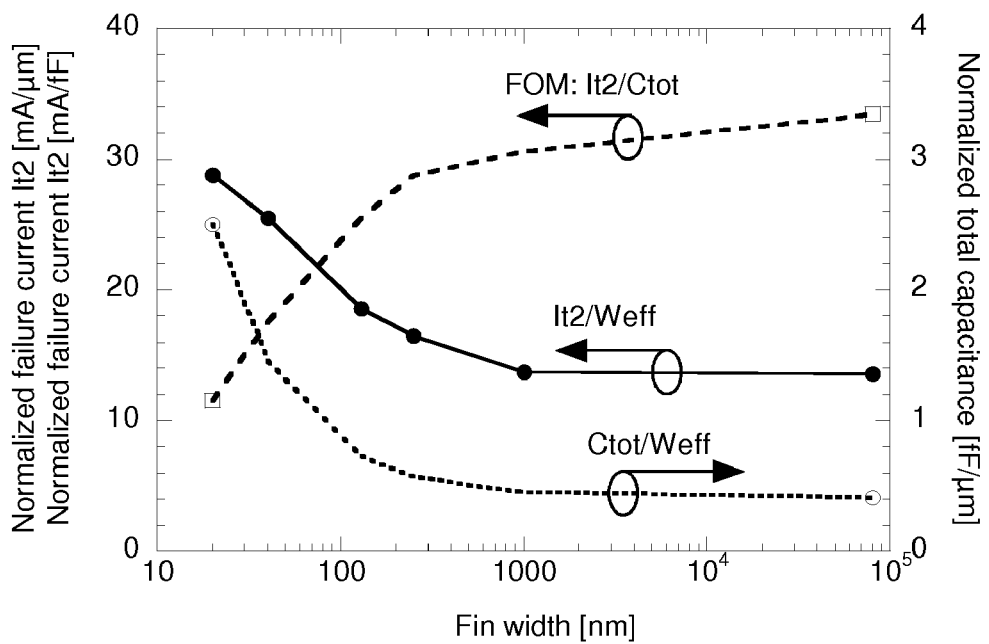
FIG. 19 shows the normalized $It_2$ and parasitic capacitance per effective silicon width as a function of fin width. The derived FOM ($It_2/C_{tot}$) is improving with increasing fin width. The symbols indicate measurement data points.

$It_2$ and total capacitance, both normalized towards effective silicon width are shown in FIG. 19 as a function of fin width together with the derived FOM ($It_2$ per capacitance). Symbols indicate measurement results while for intermediate fin width, the parasitic capacitance is calculated using (4). The large overhead capacitance of the narrow fin devices degrades the FOM with respect to the wide fin devices, making wide fin devices the preferred choice. Note that almost 20% of $C_{oh}$ can be attributed to the usage of SEG as described in [10].

When considering parasitic capacitance instead of minimal area consumption, again the optimal solution is a wide-fin diode and no trade-offs are currently present. However, when technology keeps evolving, the different dependencies might change, making the design methodology necessary.

Appendix

Equation (A1) describes the contribution of the junction capacitance $C_j$ and the overhead capacitance $C_{oh}$ to the total parasitic capacitance $C_{tot}$. The parasitic capacitance $C_{narrow}$ was measured for a narrow fin device ($N_{fin}=N_{narrow}$ and $W_{fin}=W_{narrow}$). Similarly, the parasitic capacitance $C_{pla}$ was measured on a single planar fin device ($N_{fin}=1$ and $W_{fin}=W_{pla}$). A solution for $C_j$ and $C_{oh}$ can be analytically derived as a function of the narrow and wide fin devices and is given in (A2) and (A3) respectively.

$$C_{tot}[fF] = C_j N(WH_{fin}) + C_{oh} N(W+2H) \quad (A1)$$

$$C_j[fF/\mu m^2] = \frac{N_{fin}(W_{fin} + 2H_{fin})\frac{C_{pla}}{W_{pla}} - C_{fin}}{2N_{fin}H_{fin}^2} \quad (A2)$$

$$C_{oh}[fF/\mu m] = \frac{2H_{fin}C_{fin} - \left(N_{fin}\left(\frac{W_{fin}+}{2H_{fin}}\right)\frac{C_{pla}}{W_{pla}} - \right)W_{fin}}{2N_{fin}H_{fin}(W_{fin}+2H_{fin})} \quad (A3)$$

V. IMPACT OF PROCESS OPTIONS

In the above described embodiments of the invention, the optimization focuses on the layout parameters. Below, the possibility of optimizing multi-gate FET devices for ESD protection using process parameters is discussed.

The FinFET technology copes with many challenges such as a reduced mobility, high access resistance, requirement for $V_T$ adjustment without body doping, variability, SCE control . . . . Different process options can be introduced to improve these parameters. These process options will also have an impact on the ESD robustness. Therefore, it is important to investigate this influence upfront. In this section, the impact of well implants, SEG, strain and silicide blocking is discussed.

A. Well Implants

A very important ESD design constraint is the maximum allowed leakage current through the ESD clamp device. Previously, wide fin devices have been shown to have the best ESD performance per layout area. However, concluding from these results that the best ESD device would be a device with wide fins is not correct. This is because they need also a longer gate to keep control on the SCE, which leads to an increased $V_h$ and $R_{on}$. Well implants can be used to reduce the leakage for wide fin devices.

Figure 21:
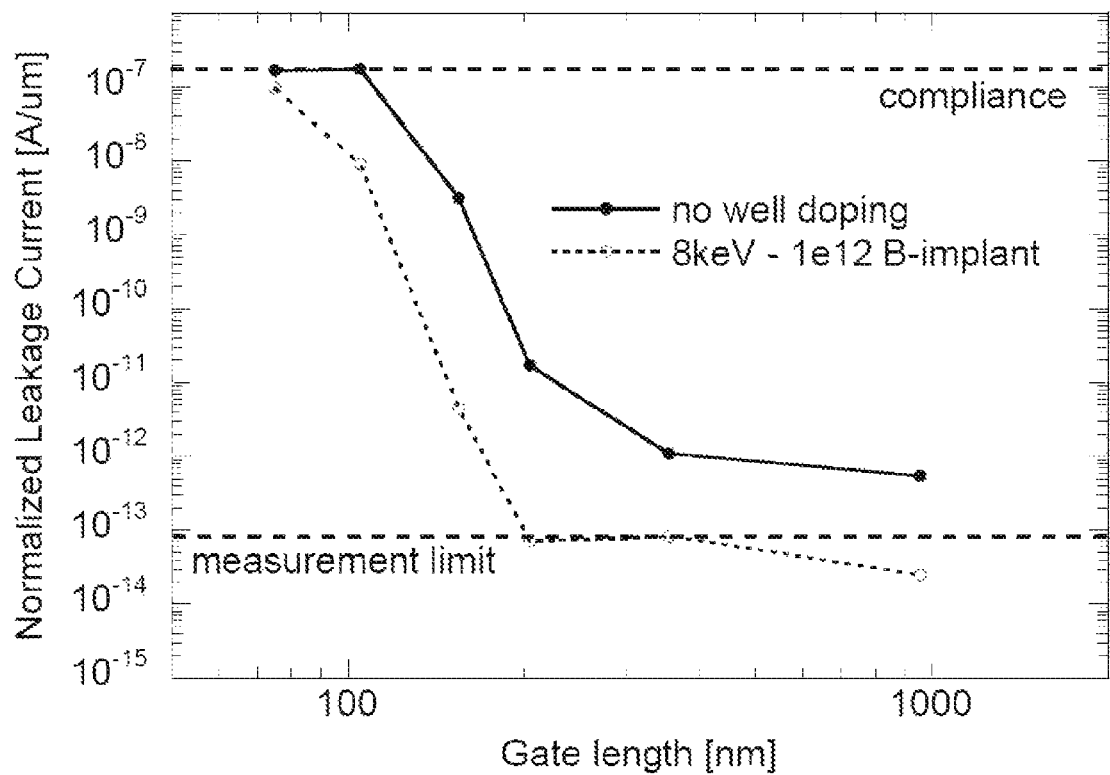
FIG. 21 shows the normalized leakage current at 1V as a function of gate length for 40 μm wide fin N-type FinFET devices for different well doping levels.
Figure 22:
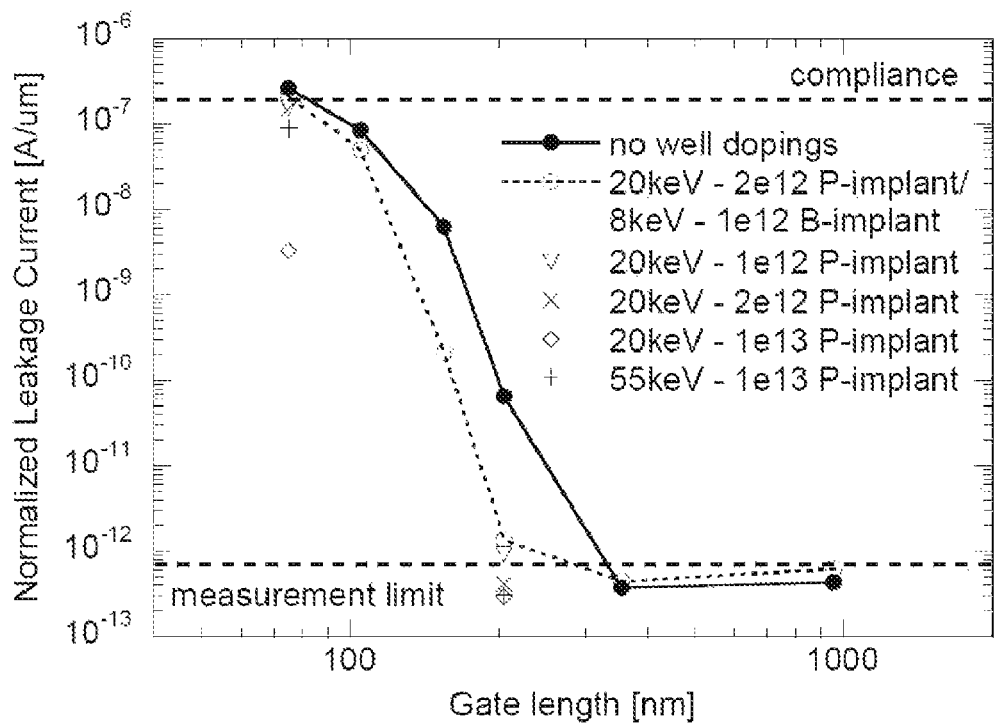
FIG. 22 shows the normalized leakage current at 1V as a function of gate length for 40 μm wide fin P-type FinFET devices for different well doping levels.

For narrow fin devices, $V_T$ is determined by the workfunction of the metal gate since the full depletion makes tuning of $V_T$ with implantation very difficult. However, for wide fin devices fin doping can easily tune $V_T$. The impact of fin-doping on the leakage current of 40 μm wide N-type and P-type FinFET devices is illustrated in FIG. 21 and FIG. 22 respectively. The leakage current was obtained at a drain bias of 1 V with source and gate grounded and was normalized towards $W_{eff}$. FIG. 21 shows that adding Boron in the NMOS fin body reduces the leakage current for a given gate length. As a consequence, such a wide fin device can meet leakage requirements with a smaller $L_g$ which directly results in reduced $V_h$ and $R_{on}$. More implant variations were available for PMOS devices (FIG. 22). An increased Phosphorus dose results in decreased leakage current. When increasing the implant energy for the highest P-dose condition from 20 keV to 55 keV, the leakage increases again. Using these conditions, the dose is concentrated near the bottom of the fin and part of the dose is lost in the buried oxide.

No major impact of well implants on the other ESD performance parameters was measured. If well implants are available, they should preferably be used for the ESD protection devices. When not available, one might consider to introduce well implants specifically optimized for ESD purposes. This would also open up the window for implementation of other types of ESD protection devices such as the Silicon Controlled Rectifier (SCR) devices.

B. Selective Epitaxial Growth (SEG)

For the 32 nm technology node, fin widths smaller than 10 nm may be needed to maintain good short channel behavior. For these narrow fin devices, the access resistance is very high. SEG on source and drain areas is typically used to reduce the contact resistance, by almost 50%. Due to the increased silicon volume, also the problem of over-silicidation is greatly reduced, leading to a decrease in leakage current of 4 orders of magnitude.

Because SEG has very little impact on wide fin devices, only narrow fin devices are used to study the effect of SEG on ESD. The wafers used for the study of SEG did not receive tCESL.

Figure 23:
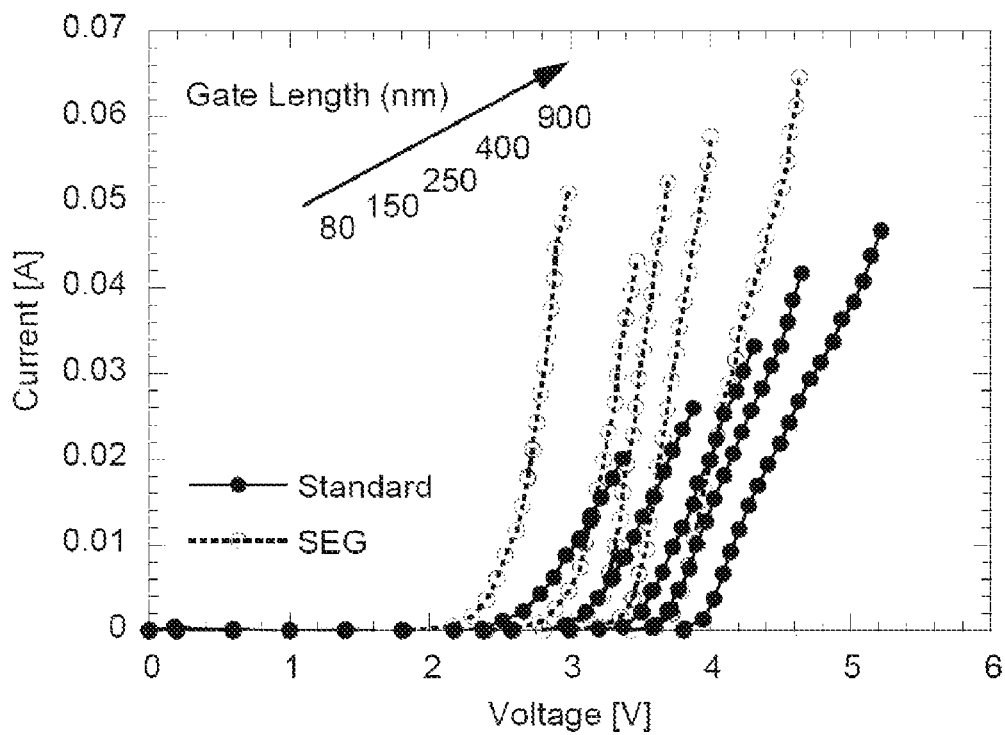
FIG. 23 shows TLP-IV curves of N-type FinFET in bipolar mode as a function of gate length for wafers processed with and without SEG. The devices have a fin width of 25 nm and 225 fins in parallel.
Figure 24:
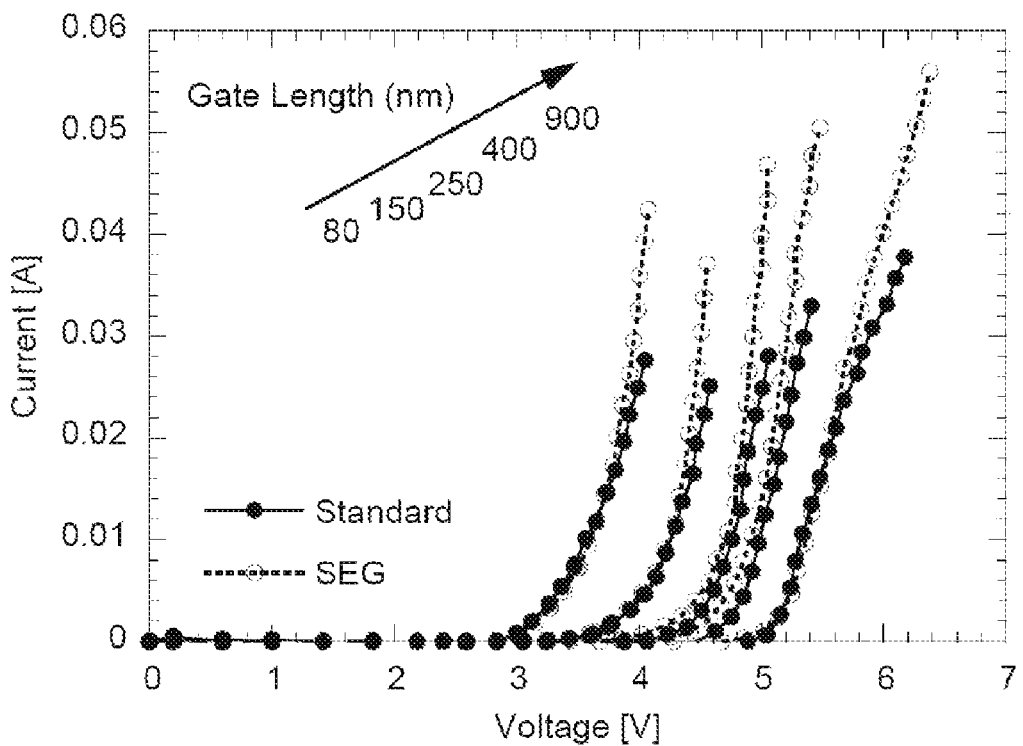
FIG. 24 shows TLP-IV curves of P-type FinFET in bipolar mode as a function of gate length for wafers processed with and without SEG. The devices have a fin width of 25 nm and 225 fins in parallel.

FIG. 23 and FIG. 24 show the influence on narrow fin N- and P-type FinFETs respectively for different $L_g$. For both NMOS and PMOS, SEG increases $It_2$ drastically and lowers $R_{on}$, while the dependency on $L_g$ remains similar. The improved robustness can be mainly attributed to the better heat removal and storage from the drain-body junction of the fin due to the larger fin dimensions in the source and drain access region. The PMOS behavior is less impacted by SEG because in general for PMOS FinFET devices the contact resistance is not the limiting factor but the carrier mobility.

Also the reduction of over-silicidation is a factor which increases $It_2$ for SEG devices due to improved current uniformity. The reduction of over-silicidation results in lower measurement variation for SEG and a decrease of $V_h$. The Schottky contact created during over-silicidation is a source for recombination of the carriers generated by impact ionization during turn-on of the parasitic bipolar, lowering its β. As a consequence, the required voltage to sustain bipolar operation is pushed higher than when no over-silicidation would have occurred. Since the PMOS has less problems with over-silicidation due to the presence of Boron, the decrease in $V_h$ is much less pronounced.

C. Strain

In narrow fin devices, the current flows mainly in the side-walls of the device. This change in crystal orientation degrades the electron mobility and improves the hole mobility when starting from a {100} silicon wafer with [110] current direction. A NMOS performance improvement up to 20% was measured with tCESL. The improvement seen for pMOS due to compressive strain is lower, about 10%.

Figure 25:
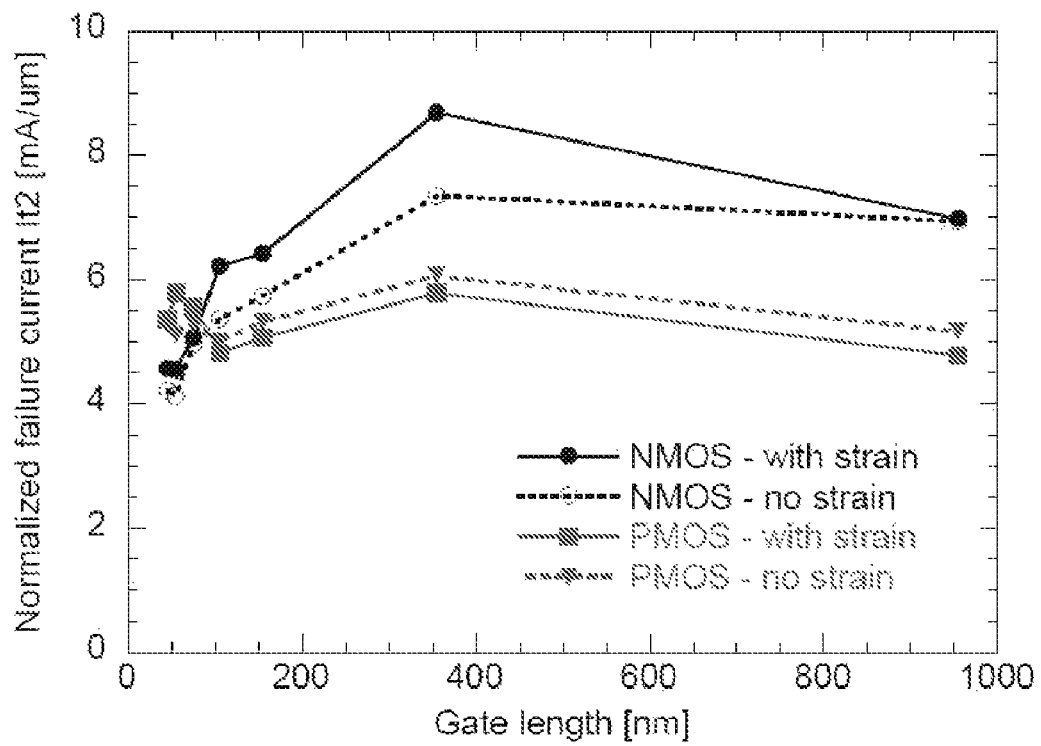
FIG. 25 shows the normalized $It_2$ as a function of gate length for FinFET devices in bipolar mode for wafers with and without tCESL. The devices have a fin width of 30 nm and 400 fins in parallel.
Figure 26:
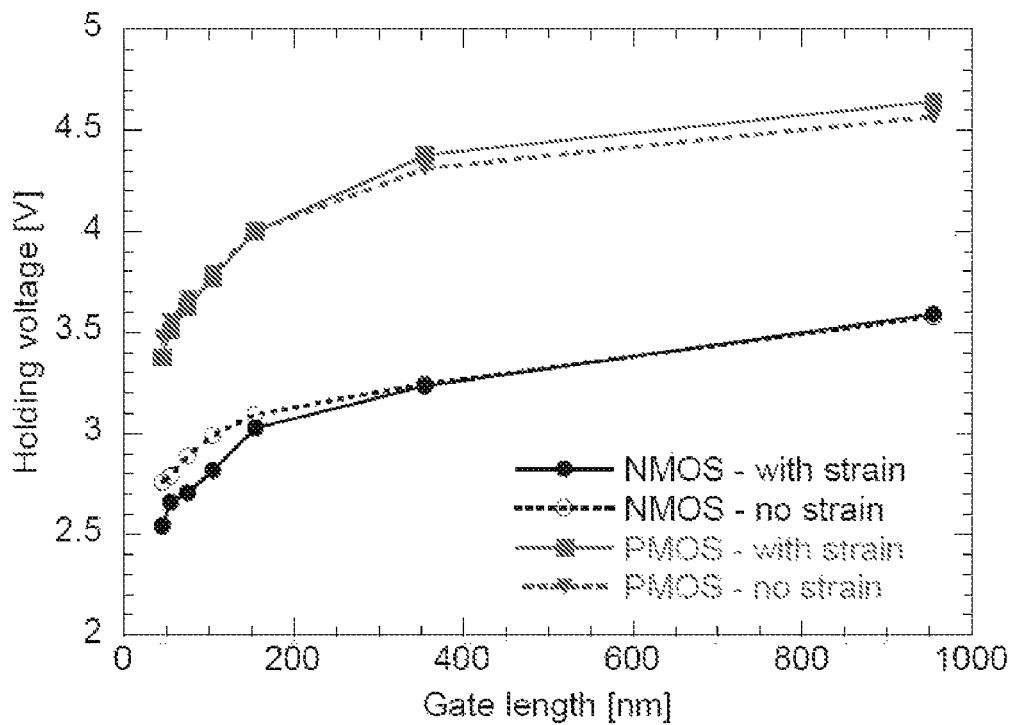
FIG. 26 shows the holding voltage of FinFET in bipolar mode as a function of gate length for wafers processed with and without tCESL. The devices have a fin width of 30 nm and 400 fins in parallel.

Since the PMOS improvement due to compressive strain is only moderate and almost no degradation of the PMOS due to tCESL is measured, a more simple process scheme with only tCESL can be used. The intrinsic normalized $It_2$ for narrow NMOS and PMOS devices with and without tCESL as a function of $L_g$ is shown in FIG. 25. An improvement up to 20% is measured for NMOS devices with medium $L_g$. It is suggested that this improvement could be attributed to a better current uniformity amongst the different fins. Only a slight reduction in $It_2$ is measured for PMOS. While $V_h$ is unchanged for PMOS, a decreased $V_h$ is measured for NMOS devices with the smallest $L_g$ as seen in FIG. 26. This improvement is due to improved electron mobility and is most pronounced for smaller gate lengths because they are more impacted by CESL. Note that SEG will reduce the mobility improvement due to strain because of the decreased proximity of the SiN liner to the channel due to the volume expansion of the fin.

D. Silicide Blocking

Figure 27:
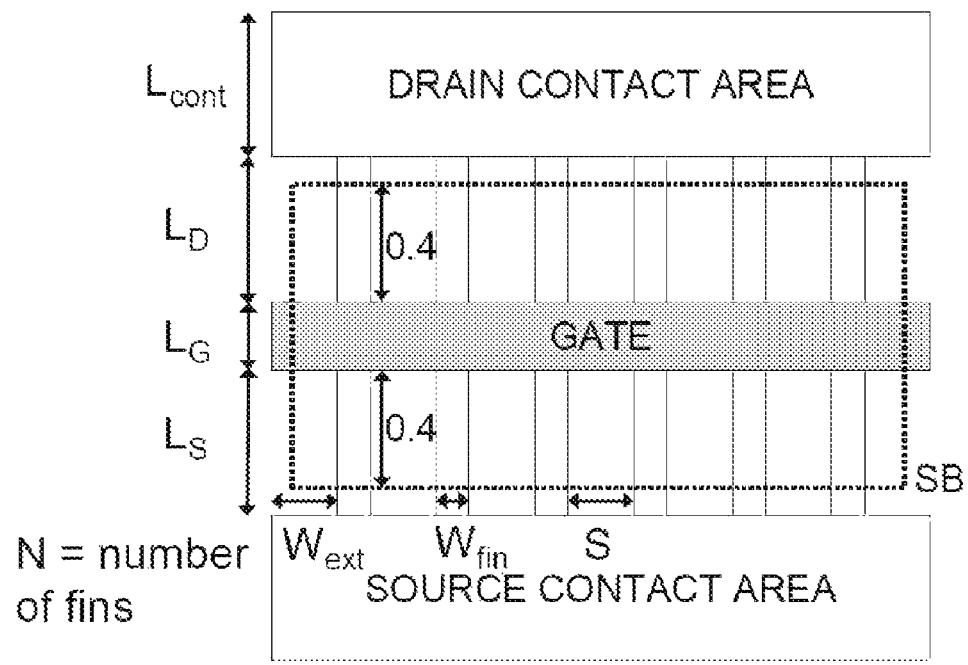
FIG. 27 shows a top layout view of a FinFET device including silicide blocking mask, optimisable according to the invention.
Figure 28:
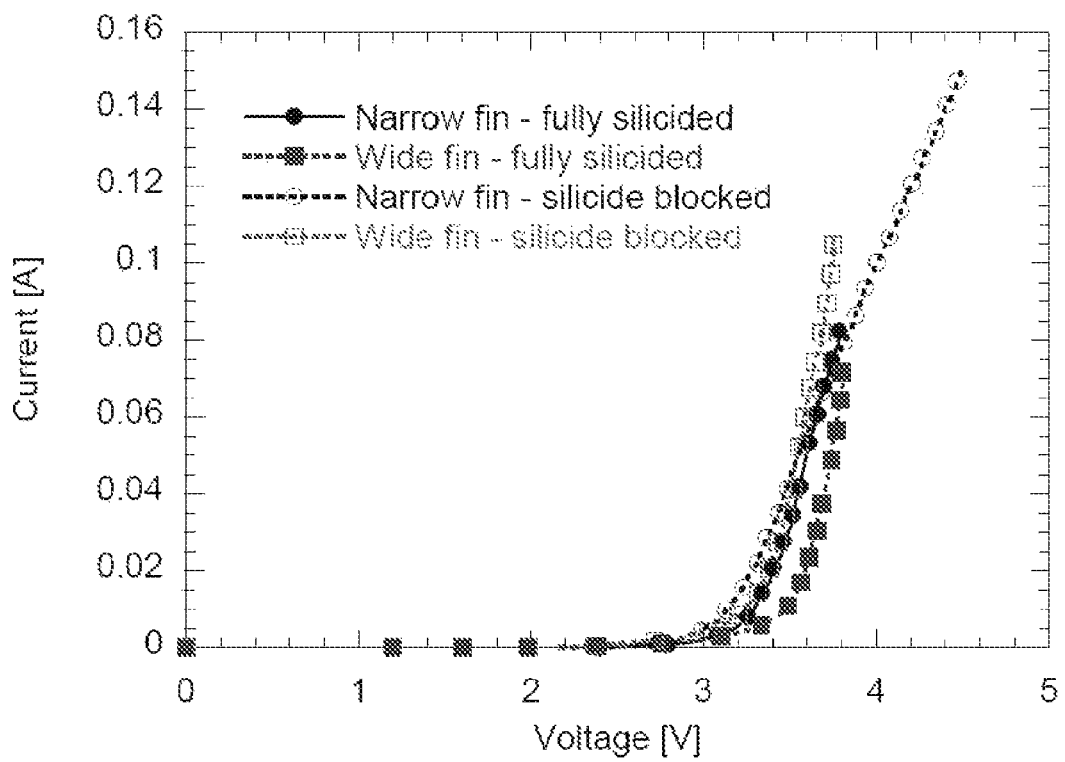
FIG. 28 shows TLP-IV curves for narrow and wide fin N-type FinFET devices with and without silicide blocking in bipolar mode. The devices have 355 nm gate length.

Silicide blocking is known as a technique to improve ESD robustness. A silicide blocking region was applied which extends 0.4 μm over the gate in both direction of source and drain (FIG. 27). LS and LD were increased to accommodate the silicide blocking region. TLP-IV-curves are shown in FIG. 28 for narrow and wide N-type FinFET devices with and without silicide blocking. It$_2$ increases for both narrow and wide fin devices. The removal of over-silicidation due to silicide blocking can be defined as the root cause for this increase in It$_2$. The measured decrease in V$_h$ for silicide blocked devices supports this claim, similar as for SEG.

VI. THERMAL TRENDS

In this section the results of TCAD analysis are discussed with which the impact of future scaling of different geometrical parameters on It$_2$ is investigated. In subsection A, first the impact of fin width scaling is investigated. Next in subsection B, fin-to-fin spacing is discussed. Subsections C and D discuss the impact of scaled fin height and BOX thickness, respectively.

A. Scaling of Fin Width

In [3], the impact of It$_2$ normalized to intrinsic silicon width (W$_{intr}$=N·W$_{fin}$) was studied for MOS devices in bipolar mode by means of TLP measurements. It was found that narrower fins have improved cooling properties leading to increased intrinsic ESD robustness.

A simplified horizontal 2D cross-section (FIG. 29 top) was used for 2D TCAD simulations for W$_{fin}$ of 30 nm, 75 nm, 175 nm and 1 µm. These simulations are preferred over actual 3D simulations because of reduced complexity and simulation time. The NMOS devices operate in bipolar mode and have 75 nm L$_g$ and 170 nm fin spacing, corresponding to the dimensions of the measured devices. The simulations represent a single fin in the center of a multi-fin device. Indeed, due to the reflective boundary conditions the structure is virtually surrounded by identical structures. In case of a 40 µm fin 'planar' device, a vertical 2D cross-section as in FIG. 29 (bottom) could be considered. However, such a vertical cross-section requires the presence of the BOX to avoid a (virtual) second gate at the bottom and hence ensure correct boundary conditions. This would prevent a direct comparison to the horizontal simulations, where no vertical temperature gradient is possible. Therefore, only horizontal devices are used in simulation, the 1 µm fin width being representative of a wide planar device. The simplification of removing the vertical temperature gradient leads to an overestimation of the temperature, and hence only trends can be obtained.

Figure 30:
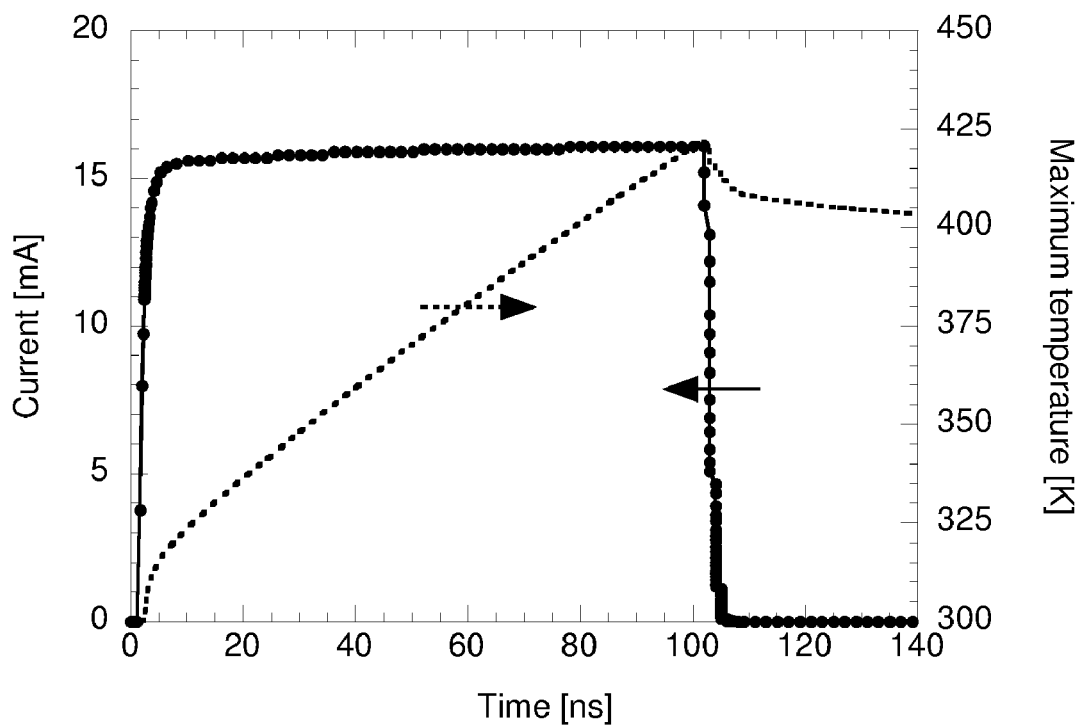
FIG. 30 shows a TCAD simulation of maximum temperature as function of time during a 15 mA (1.25 mA/μm) TLP current pulse for $W_{fin}$ of 30 nm. The NMOS device in bipolar mode has 75 nm $L_g$.
Figure 31:
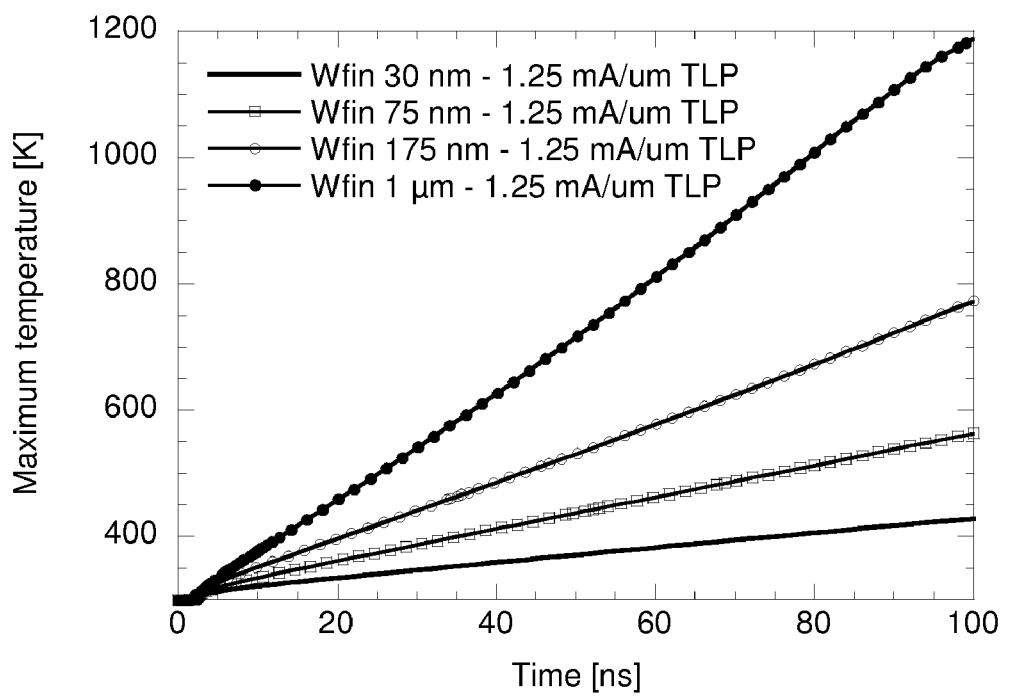
FIG. 31 shows a TCAD simulation of maximum temperature as function of time during a 1.25 mA/μm TLP current pulse for different $W_{fin}$: 30 nm, 75 nm, 175 nm and 1 μm. All NMOS devices work in bipolar mode and have 75 nm $L_g$.

A 15 mA 100 ns TLP pulse (which is 20% of It$_2$ for 400 fins of 30 nm W$_{fin}$) was simulated for a NMOS device in grounded-gate configuration and the maximum temperature was recorded. Device size normalization was performed towards W$_{intr}$, leading to identical current densities (1.25 mA/µm) for the devices with different W$_{fin}$ dimensions. The maximum temperature for a reference device consisting of 400 fins of each 30 nm width during such TLP pulse is shown in FIG. 30. At the end of the TLP pulse, the maximum temperature is 420 K, which is reached at the junction between drain and fin body. Since these devices fail non-uniformly due to isothermal current instability at high current levels, constant current density simulations are used instead of constant power. When simulating the same current density through devices with different W$_{fin}$, the maximum temperature is observed to increase with increasing W$_{fin}$ in FIG. 31. This results in a decreased It$_2$.

Figure 32:
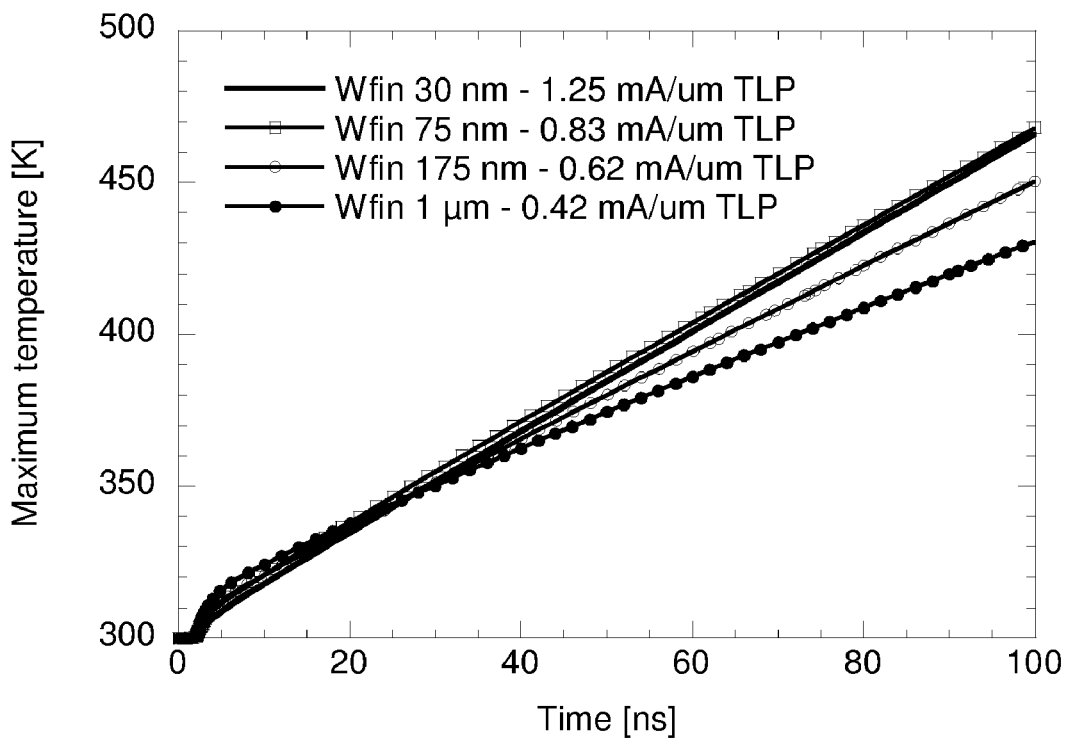
FIG. 32 shows a TCAD simulation of maximum temperature as function of time during different TLP current pulses according to the measured $It_2$ values for each $W_{fin}$ variation.

Moreover, when taking the ratio of measured It$_2$ for each W$_{fin}$ variation relative to 30 nm, and applying a lower TLP current pulse to the device corresponding to this ratio (0.83 mA/µm pulse for 75 nm, 0.62 mA/µm for 175 nm and 0.42 mA/µm for 1 µm), TCAD simulations show in FIG. 32 that all devices yield almost the same temperature behavior, within 40 K variation. This means that the It$_2$ dependence on W$_{fin}$ can be fully described by 2D-TCAD and confirms the improved heat removal by the side gates and the source/drain landing pads for the narrower fins, as was reported in [3].

Based on these results, a prediction can be made for W$_{fin}$ decreased below present minimum design rules, e.g. for 15 nm, by simulating for which TLP pulse the same temperature behavior is reached. In the case of W$_{fin}$=15 nm, the expected intrinsic performance is 8.9 mA/µm, compared to 6 mA/µm for 30 nm fin width.

B. Scaling of Fin-to-Fin Spacing

Figure 33:
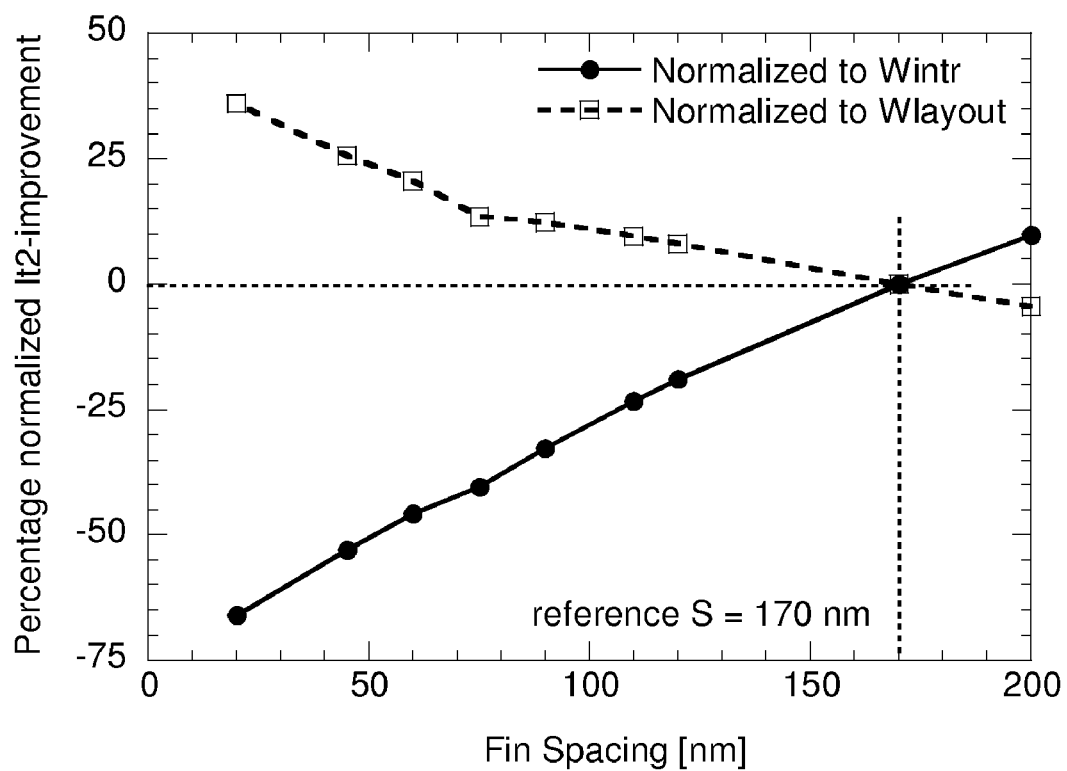
FIG. 33 shows the percentage $It_2$ improvement normalized to $W_{intr}$ and $W_{layout}$ as function of fin spacing, as predicted by TCAD simulations for NMOS devices in bipolar mode with 75 nm $L_g$.

With decreasing fin-to-fin spacing, the intrinsic robustness is expected to decrease because of increased fin-to-fin heating, while on the other hand the layout efficiency (W$_{layout}$=N·W$_{fin}$+(N−1)·S) might still be improved because of reduced area consumption. Using this TCAD methodology, a prediction can be made for such future fin-to-fin spacing. Despite that the intrinsic robustness is predicted to decrease with more than 60% when going down to fin spacing around 30 nm, the layout efficiency is expected to increase with more than 30%, FIG. 33.

C. Scaling of Fin Height

A similar 2D-TCAD approach can be used to understand the impact of reduced H$_{fin}$. When using a similar horizontal cross-section as in FIG. 29 (top), the fin height is included in the device simulation by changing the area-scaling of the device. As vertical temperature gradients are disabled by such horizontal cross-section, changing the fin height by changing the area-scaling results in a perfect scaling of It$_2$ with H$_{fin}$.

Figure 29:
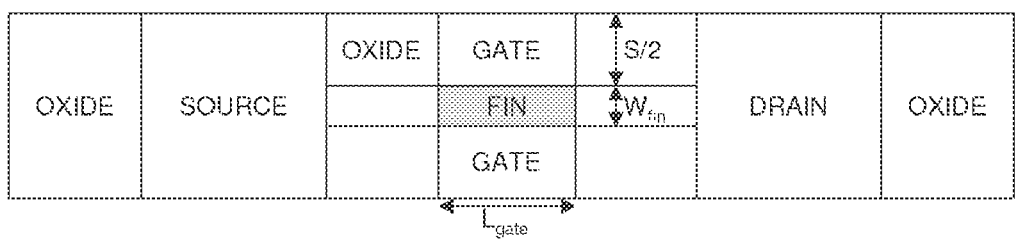
FIG. 29 shows a simplified 2D TCAD horizontal (top) and vertical (bottom) cross-section of a FinFET device.
Figure 29:
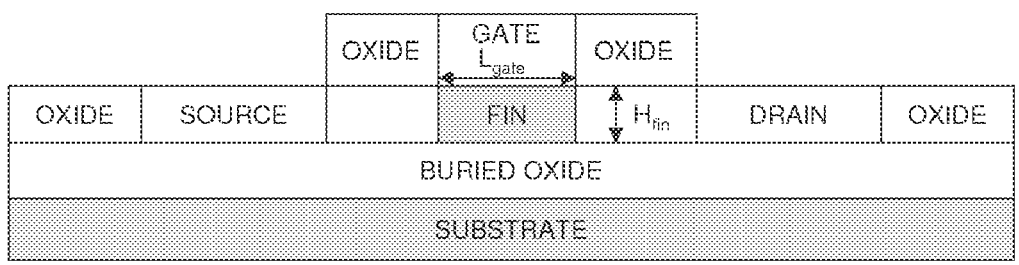

However, since H$_{fin}$ is a vertical geometrical parameter, a vertical simulation using corresponding cross-section as shown in FIG. 29 (bottom) is needed.

Figure 34:
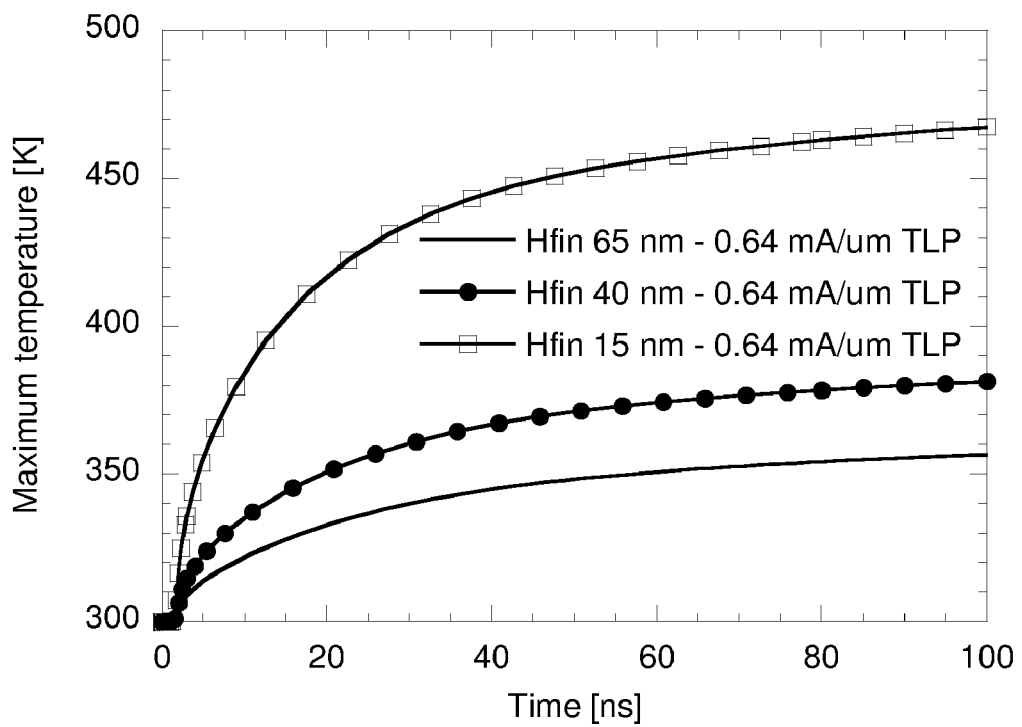
FIG. 34 shows a TCAD simulation of maximum temperature as function of time during a 0.64 mA/μm TLP current pulse for different $H_{fin}$: 65 nm, 40 nm and 15 nm. All NMOS devices work in bipolar mode and have 75 nm $L_g$.
Figure 35:
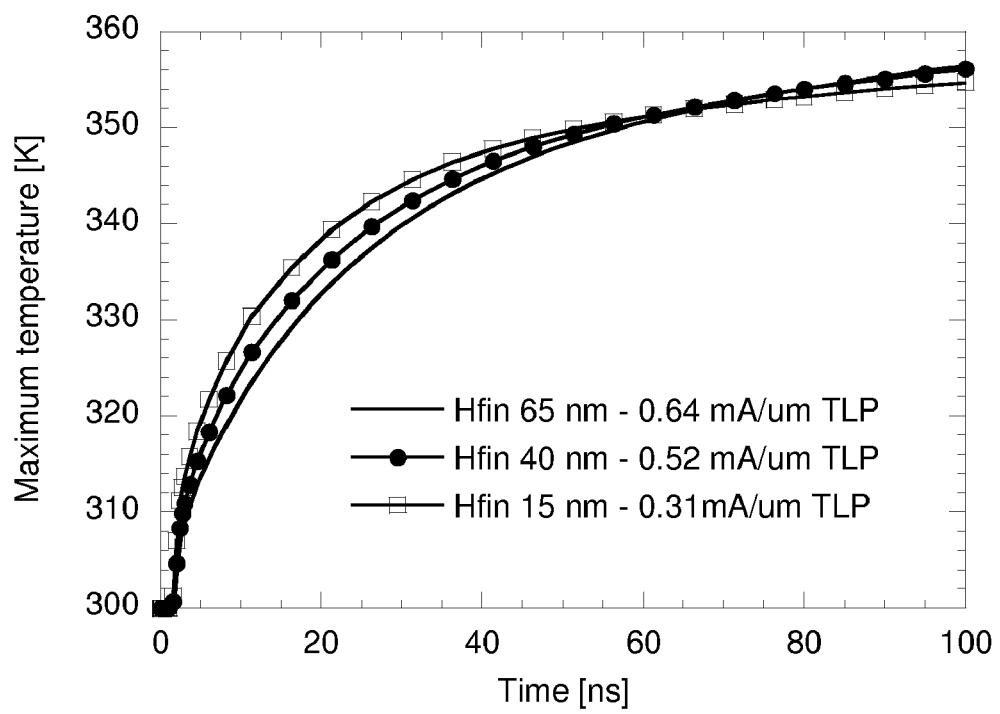
FIG. 35 shows a TCAD simulation of maximum temperature as function of time during different TLP current pulses for each $H_{fin}$ variation, allowing prediction of $It_2$. All NMOS devices work in bipolar mode and have 75 nm $L_g$.

2D vertical TCAD TLP simulations using 0.64 mA/µm current density were performed comparing the present 65 nm H$_{fin}$ with a scaled fin height to 40 nm and to Ultra-Thin-Body (UTB) of 15 nm [11] on NMOS in bipolar mode with 75 nm L$_g$. The maximum temperature during the TLP pulse is shown in FIG. 34. Obviously, forcing the same amount of current through a thinner silicon film leads to increased heating. Using the methodology as described before, the current density needs to be reduced to 0.52 mA/µm for the 40 nm H$_{fin}$ and to 0.31 mA/µm for 15 nm H$_{fin}$ to yield the same maximum temperature, FIG. 35. Based on these current ratios, an estimation of It$_2$ can be calculated.

Figure 36:
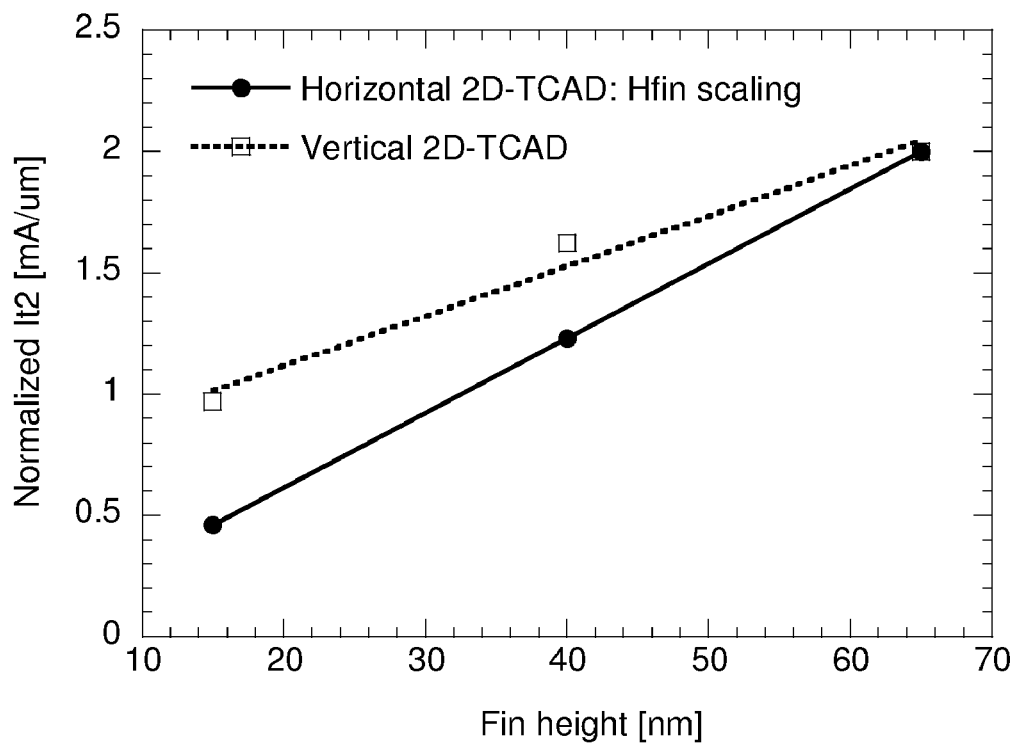
FIG. 36 shows the comparison of horizontal and vertical 2D-TCAD $It_2$ simulation as function of $H_{fin}$. The more realistic vertical TCAD gives higher $It_2$ when $H_{fin}$ decreases as compared to the horizontal TCAD, however it is only valid for wide fin devices.

Both simulations, comparing the horizontal TCAD (simple H$_{fin}$ scaling) with the vertical TCAD, are shown in FIG. 36. The more realistic vertical TCAD simulation shows that when H$_{fin}$ decreases, the It$_2$ performance is improving more than what would be expected from simple H$_{fin}$ scaling (horizontal TCAD). This improvement can be attributed to the fact that the vertical cooling by the top gate improves when the fin gets thinner because of reduced distance from the bottom of the fin (near the BOX) to the gate.

An important consideration needs to be made since this result is only valid for wide-fin devices, which is imposed by the 2D vertical TCAD. For narrow fin devices, the relative contribution from the top gate to the heat removal is much less because it is mostly governed by the side gates. 2D TCAD simulation for narrow fin devices requires a horizontal cross-section, which is contradicting the required vertical cross-section for H$_{fin}$ scaling and hence such simulations require complex 3D TCAD for more accurate results. The expected dependency on H$_{fin}$ for narrow fin devices lies somewhere in between both curves in FIG. 36. For H$_{fin}$ scaling for narrow fin devices, the worst-case simple linear H$_{fin}$ scaling according to the horizontal cross-section can be used when predicting the performance of the future processing targets.

D. Scaling of BOX Thickness

The impact of BOX scaling ($T_{BOX}$) and tradeoffs focusing on the short-channel characteristics have been experimentally verified in [12] demonstrating improved $V_T$-rolloff and subthreshold slope characteristics for reduced $T_{BOX}$. On the other hand, increased junction capacitance resulting from BOX scaling reduces the inverter delay with 10% for 5 nm $T_{BOX}$. Further, a decreased $T_{BOX}$ is known to improve the heat dissipation [13] and therefore should be beneficial for ESD robustness.

Figure 37:
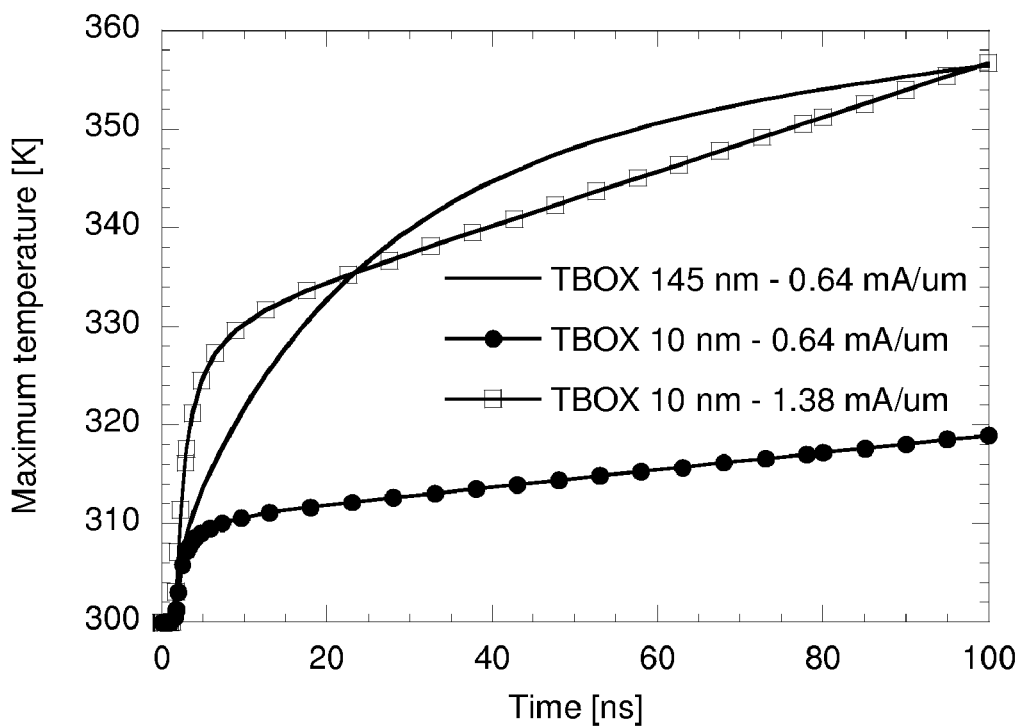
FIG. 37 shows a TCAD simulation of maximum temperature as function of time during a 0.64 mA/μm and 1.38 mA/μm TLP current pulse for different $T_{BOX}$: 145 nm and 10 nm. All NMOS devices work in bipolar mode and have 75 nm $L_g$.
Figure 38:
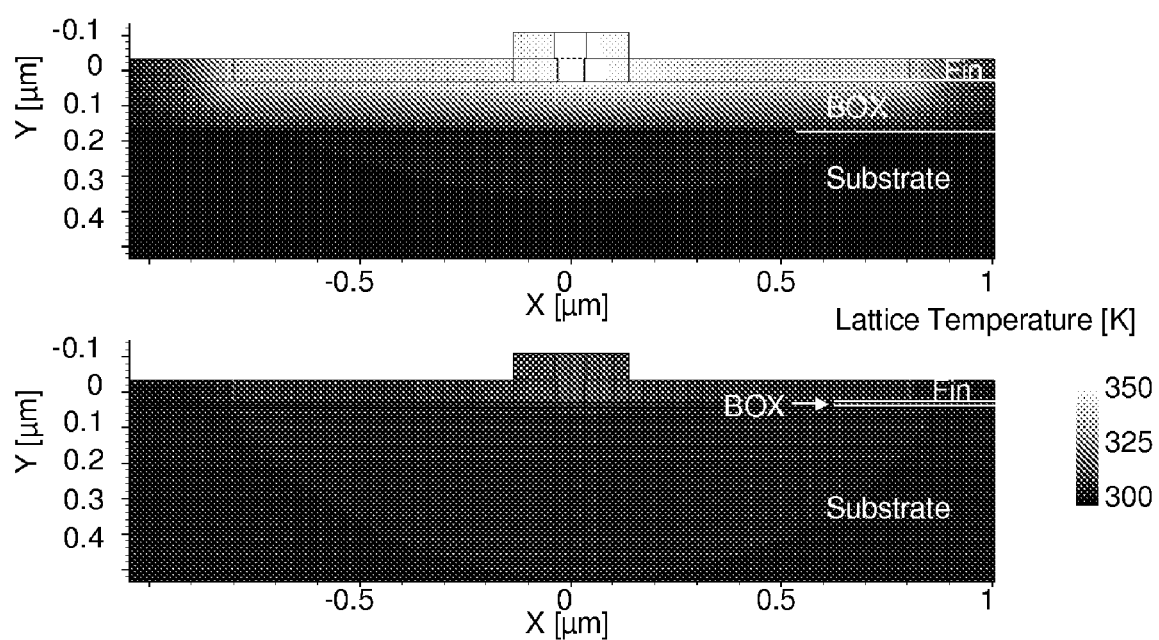
FIG. 38 shows temperature profiles captured at 80 ns during a 0.64 mA/μm TLP pulse for both 145 nm $T_{BOX}$ (top) and 10 nm $T_{BOX}$ (bottom).

As $T_{BOX}$ is a vertical geometrical parameter, the cross-section as in FIG. 29 (bottom) is used, similarly as for the $H_{fin}$ scaling and hence the results are only applicable for wide fin devices. The heating of a NMOS device with an ultra-thin BOX of 10 nm is compared to the reference 145 nm $T_{BOX}$ by the TCAD simulation in FIG. 37. Increasing the current density to 1.38 mA/μm for 10 nm $T_{BOX}$, yields the same maximum temperature after 100 ns as for 145 nm $T_{BOX}$ during a 0.64 mA/μm TLP pulse resulting in a doubling of the expected It$_2$ level. The temperature profiles were captured during the 0.64 mA/μm TLP simulation after 80 ns for both 145 nm and 10 nm $T_{BOX}$ and are shown in FIG. 38 on top and bottom respectively. The thicker $T_{BOX}$ clearly prevents heat transfer to the substrate and hence causes increased heating of the silicon fins.

VII. CONCLUSIONS

This invention comprises a design methodology with which one can take into account all complex dependencies of FinFET layout parameters on the ESD device parameters for MOSFET devices in both bipolar and MOS diode mode and for gated diodes.

For the first time, an ESD protection level up to 3.4 kV HBM is demonstrated for a FinFET device and similar results and trends are obtained when using TLP measurements. The scalability of the ESD HBM robustness towards such levels is an important step towards full-IC ESD protection levels. The validity of the design methodology for HBM type of ESD stress has been proven. By using the methodology, also a deeper insight into the different trade-offs is obtained.

The design methodology can be generally used for optimizing any set of layout and/or process parameters towards any ESD performance parameter (e.g. area, leakage current, parasitic capacitance, . . . ) while being limited to a set of certain design constraints.

This methodology is demonstrated above by optimizing towards the minimum-area solution which meets given design constraints, namely ESD robustness, leakage current and maximum allowed voltage for MOSFET devices. Parasitic capacitance is considered above for gated diodes.

Because technology keeps on changing, the different dependencies may change as well. For example, with reduced fin spacing, small fin devices may have a "space" advantage regarding planar for the same total channel width, however this can be mitigated by the thermal aspect and/or $R_{on}$. Application of the presented design methodology remains valid and preferable since these multiple trade-offs are to be considered simultaneously.

Further, a simple TCAD simulation methodology was used to analyze the thermal behavior as a function of the different geometrical parameters fin width, fin-to-fin spacing, fin height and thickness of the BOX. These results can be combined to complement the prediction of the thermal behavior of upcoming process targets.

The invention can be further used to design an optimal ESD protection strategy for a given circuit application.

References

[1] International Technology Roadmap of Semiconductors (ITRS), Available: http://www.itrs.net.
[2] J. A. Choi et al, "Large Scale Integration and Reliability Consideration of Triple Gate Transistors", IEDM Techn. Dig. 2004, pp 647-650.
[3] D. Trémouilles et al, "Understanding the Optimization of Sub-45 nm FinFET Devices for ESD Applications", EOS/ESD Symposium 2007, pp 408-415.
[4] N. Collaert et al, "Multi-Gate Devices for the 32 nm Technology Node and Beyond", ESSDERC 2007, pp 143-146.
[5] N. Collaert et al, "Tall Triple-Gate Devices with TiN/HfO$_2$ Gate Stack", VLSI Symposium, 2005, pp 108-109.
[6] M. Scholz et al, "Calibrated wafer-level HBM measurements for quasi-static and transient device analysis", EOS/ESD Symposium 2007, pp 89-94.
[7] T. Hoffmann et al, "GIDL and Parasitic Schottky Barrier Leakage Elimination in Aggressively Scaled HfO$_2$/TiN FinFET Devices", IEDM Tech. Dig. 2005, pp 725-728.
[8] N. Collaert et al, "Multi-gate Devices for the 32 nm Technology Node and Beyond: Challenges for Selective Epitaxial Growth", Abstract book ICSI-5, 2007, pp 129-130.
[9] W. Wu et al, "Analysis of Geometry-Dependent Parasitics in Multifin Double-Gate FinFETs", IEEE Trans. Electron Devices, vol. 54, no. 4, pp 692-698, 2007.
[10] B. Parvais et al, "Analysis of the FinFET Parasitics for Improved RF Performances", IEEE International SOI Conference, 2007, pp 37-38.
[11] E. Augendre et al, "On the Scalability of Source/Drain Current Enhancement in Thin Film sSOI", ESSDERC 2005, pp. 301-304.
[12] M. Fujiwara et al, "Impact of BOX Scaling on 30 nm Gate Length FD SOI MOSFET", IEEE Int. SOI Conf. 2005, pp. 180-182.
[13] L. J. McDaid et al, "Physical Origin of Negative Differential Resistance in SOI Transistors", Electronics Letters, vol. 25. no. 13, pp. 827-828, 1989.

What is claimed is:

1. A method for manufacturing a multi-gate field-effect transistor (MuGFET) electrostatic discharge (ESD) protection device having a given layout by means of a given manufacturing process, comprising:

selecting multiple combinations of possible layout and process parameter values including at least fin width, gate length, and number of fins, each of said combinations being selected to meet predetermined ESD constraints for said MuGFET ESD protection device, determining multiple values for at least one other parameter having a predetermined relationship with said fin width, gate length, and number of fins, determining for said at least one other parameter an optimum value in view of a predetermined design target apart from said predetermined ESD constraints, determining parameter values for said fin width, gate length, and number of fins substantially on the basis of the optimum value determined of the one other parameter, and manufacturing said MuGFET ESD protection device substantially using said optimum value of the at least one other parameter and the determined parameter values for fin width, gate length, and number of fins.

2. The method according to claim 1, wherein the optimum value is determined by interpolation while taking into account said predetermined ESD constraints.

3. The method according to claim 1, wherein said selecting step includes selecting multiple combinations of possible layout and process values further including: a distance between landing pad and gate, an overlap amount of the gate past the fins, and a fin-to-fin spacing.

4. The method according to claim 1, wherein said selecting step includes selecting multiple combinations of possible layout and process values further including: strain, well implants, selective epitaxial growth, silicide blocking, and thickness of buried oxide.

5. The method according to claim 1, wherein said selecting step includes selecting multiple combinations of possible layout and process values further including: a contact area and a folding factor of said device.

6. The method according to claim 1, wherein said at least one other parameter comprises is selected from the group consisting of: overall area of said device, maximum voltage, maximum voltage during voltage overshoot, leakage current, and capacity.

7. The method according to claim 1, wherein said MuG-FET ESD device is a metal oxide semiconductor (MOS) clamp provided for operating either in parasitic bipolar or active MOS diode mode.

8. The method according to claim 7, wherein said MOS clamp is designed for operating in bipolar mode, wherein the predetermined ESD constraints comprise an ESD stress which the device must be able to sustain, while meeting a given leakage specification and without exceeding a given maximum voltage, and wherein said predetermined design target is a minimum overall area of said MOS clamp.

9. The method according to claim 8, wherein the given maximum voltage is the gate oxide breakdown voltage.

10. The method according to claim 7, wherein said MOS clamp is designed for operating in MOS diode mode, wherein the predetermined ESD constraints comprise an ESD stress which the device must be able to sustain, while meeting a given leakage specification and without exceeding a given maximum voltage, and wherein said predetermined design target is a minimum overall area and a minimum number of fins of said MOS clamp.

11. The method according to claim 10, wherein the given maximum voltage is the gate oxide breakdown voltage.

12. The method according to claim 1, wherein said MuG-FET ESD device is a gated diode and said predetermined design target is a minimum parasitic capacity.

13. The method according to claim 1, wherein said MuG-FET ESD device is a Grounded-Gate-NMOS MuGFET device.

* * * * *